(12) United States Patent
Beder et al.

(10) Patent No.: US 7,589,903 B2
(45) Date of Patent: *Sep. 15, 2009

(54) PROJECTION OBJECTIVE ADAPTED FOR USE WITH DIFFERENT IMMERSION FLUIDS OR LIQUIDS, METHOD OF CONVERSION OF SUCH AND PRODUCTION METHOD

(75) Inventors: Susanne Beder, Aalen (DE); Wilhelm Ulrich, Aalen (DE); Heiko Feldmann, Schwaebisch Gmuend (DE); Wolfgang Singer, Aalen (DE); Toralf Gruner, Aalen-Hofen (DE)

(73) Assignee: Carl Zeiss SMT AG, Oberkochen (DE)

( * ) Notice: Subject to any disclaimer, the term of this patent is extended or adjusted under 35 U.S.C. 154(b) by 440 days.

This patent is subject to a terminal disclaimer.

(21) Appl. No.: 11/420,103

(22) Filed: May 24, 2006

(65) Prior Publication Data

US 2008/0273248 A1    Nov. 6, 2008

Related U.S. Application Data

(60) Provisional application No. 60/685,092, filed on May 25, 2005.

(51) Int. Cl.
*G02B 3/00* (2006.01)
*G02B 3/12* (2006.01)

(52) U.S. Cl. .................. 359/649; 359/665; 359/666

(58) Field of Classification Search ......... 359/649–651, 359/665–667
See application file for complete search history.

(56) References Cited

U.S. PATENT DOCUMENTS

| 7,221,514 | B2 * | 5/2007 | Venema ................. 359/619 |
| 7,277,231 | B2 * | 10/2007 | Schuster et al. .......... 359/665 |
| 2004/0109237 | A1 | 6/2004 | Epple et al. |
| 2005/0219707 | A1 * | 10/2005 | Schuster et al. .......... 359/665 |

* cited by examiner

*Primary Examiner*—Scott J Sugarman
(74) *Attorney, Agent, or Firm*—Darby & Darby P.C.

(57) ABSTRACT

The invention relates to a projection objective (6), in particular for applications in microlithography, serving to project an image of an object (3) arranged in an object plane (4) onto a substrate (18) arranged in an image plane (7). The projection objective (6) has an object-side-oriented part (10) which is arranged adjacent to the object plane (4) and includes a plurality of optical elements, and it also has an image-side-oriented part (11) of the objective which is arranged adjacent to the image plane (7) and includes a free space (16) serving to receive a fluid (13) and further includes at least a part of an optical end-position element (14) serving to delimit the free space (16) towards the object side. The projection objective (6) is operable in different modes of operation in which the free space (16) is filled with fluids (13) that differ in their respective indices of refraction.

51 Claims, 7 Drawing Sheets

PROJECTION OBJECTIVE ADAPTED FOR USE WITH DIFFERENT IMMERSION FLUIDS OR LIQUIDS, METHOD OF CONVERSION OF SUCH AND PRODUCTION METHOD

CROSS-REFERENCE TO RELATED APPLICATION

The present application claims priority to U.S. provisional patent application Ser. No. 60/685,092, filed May 25, 2005, which is hereby incorporated by reference in its entirety.

TECHNICAL FIELD

The invention relates to a projection objective, in particular for the field of microlithography. The invention further relates to a method of converting a projection objective from a first mode of operation to a second mode of operation, and to a method for the manufacture of projection objectives.

BACKGROUND

Projection objectives are used for example in the manufacture of electronic building elements or other micro-structured components. In the manufacturing process, a template which is also referred to as a mask or reticle is optically projected by means of the projection objective onto a substrate which carries a light-sensitive coating.

The trend towards ever higher packaging densities in electronic building elements and the miniaturization which also progresses in other areas have the consequence that structures are being produced with continually decreasing dimensions. Accordingly, more stringent requirements are imposed on the projection objective being used, wherein the interest is focused particularly on the achievable resolution.

The shorter the operating wavelength and the larger the numerical aperture of the projection objective, the smaller are the structures that can be resolved and that can thus still be imaged. In order to resolve the smallest possible structures, projection objectives are therefore designed for shorter and shorter operating wavelengths. However, these efforts are challenged by the increasing difficulty of finding materials which are sufficiently transparent at the operating wavelength and from which the optical elements of the projection objective can be made with the required accuracy and at a justifiable cost. A particularly high numerical aperture can be attained with an immersion fluid that has a refractive index greater than 1 and occupies the space between a last optical element of the projection objective and the substrate surface. The immersion fluid takes the place of the gas or gas mixture which otherwise fills this space and has a refractive index close to 1.

The known state of the art already includes projection objectives which can be operated selectively with an immersion fluid or with a gas in the space between the last optical element and the substrate surface. For example, a method is disclosed in DE 102 58 718 A1 which allows the projection objective to be adapted between an immersion configuration and a dry configuration so that it can be used selectively as an immersion objective or as a dry objective. In the final outcome, this possibility of combining the two operating modes promotes the use of the immersion technique in projection objectives, because projection objectives of this convertible type can first serve as a replacement for purely dry objectives and because the immersion technique can also be used on a trial basis, keeping the return to the conventional dry technique open.

Nevertheless, the use of the immersion technique still involves a considerable degree of cost and complexity. Regardless of whether a pure immersion objective or a combined immersion/dry objective is being used, the procedure for developing immersion objectives is still to select the most ideal immersion fluid possible and to design the projection objective to be compatible with the selected immersion fluid. However, this has the consequence that only "established" immersion fluids find application, because in view of the high development costs, there is a desire to eliminate potential risk factors such as for example a not previously proven immersion fluid.

To the extent that the foregoing relates to DE 102 58 718 A1, it refers only to some individual aspects that are of interest in the present context and does not represent a binding interpretation of the content of DE 102 58 718 A1.

SUMMARY

It is an object of the invention to provide at a justifiable cost a projection objective whose design is optimized as much as possible for an immersion mode of operation under a given set of conditions.

The projection objective according to the invention which serves to project an image of an object arranged in an object plane onto a substrate arranged in an image plane is intended in particular for applications in microlithography. The projection objective has an object-side-oriented part of the objective which is arranged adjacent to the object plane and includes a plurality of optical elements. The projection objective further has an image-side-oriented part of the objective which is arranged adjacent to the image plane and includes a free space which can receive a fluid and also includes at least a part of an optical end-position element which serves to delimit the free space towards the object side. The projection objective is operable in different modes of operation in which the free space is filled with fluids that differ in their respective indices of refraction.

With the use of a suitable fluid, the projection objective can be adapted to the conditions of the intended application. This includes for example the possibility of using a fluid of a very high refractive index in order to achieve the highest possible depth of focus or DOF, for short. A high depth of focus makes it possible to use comparatively large tolerances in the positioning accuracy of the substrate and thereby facilitates the control of the process. In cases where a high depth of focus is not required, on can use a fluid of a lower refractive index which is available at a lower cost and is easy to handle.

Newly available fluids, including in particular fluids with very high refractive indices, can be used in accordance with the invention in a pre-existing projection objective, so that a costly development and manufacture of a new projection objective is not necessary in order to make use of such fluids. This means that on the one hand the projection objective according to the invention can be operated with currently available fluids, and on the other hand the option is kept open to use fluids that become available in the future, in particular fluids with high refractive indices.

Where parameters are named hereinafter which are dependent on the wavelength at which the projection objective is operated, the numerical values given are for an operating wavelength of 193 nm. However, the invention is equally applicable to other operating wavelengths, with a preference for using operating wavelengths in the UV range such as for example 248 nm or 157 nm, etc.

When one fluid is exchanged for another, it is normally necessary to make changes on the image-side-oriented part of the objective, so that the latter may be configured differently in the different respective modes of operation.

Instead of designing a projection objective in such a way that it can be operated in different operating modes, the projection objective can also be made specifically for one mode of operation. A projection objective of this type is assembled by combining the object-side-oriented part of the objective with one of several design versions of the image-side-oriented part of the objective. The design versions of the image-side-oriented part of the objective are adapted to the different operating modes of the projection objective where the respective immersion fluids that are filled into the free space provided for it have different refractive indices.

To produce a projection objective in which a specific fluid is to be used, it is not necessary to redesign the entire projection objective. Rather, one only has to combine the object-side-oriented part of the objective with a suitable version of the image-side-oriented part of the objective. If one wishes to use a new fluid for which a suitable version of the image-side-oriented part of the objective is not yet available, it is likewise unnecessary to undertake a complete redesign of the projection objective. Instead, only the image-side-oriented part of the objective needs to be adapted to the new fluid, and the thus adapted version of the image-side-oriented part of the objective needs to be combined with the object-side-oriented part of the objective.

The projection objective according to the invention can thus be either manufactured for operation with a desired fluid or retrofitted later for operation with a desired fluid. The invention is in either case applicable likewise to the complementary case where the part of the objective that is referred to herein as the object-side-oriented part is arranged adjacent to the image plane, and the part of the objective that is referred to herein as the image-side-oriented part is arranged adjacent to the object plane.

The free space for the fluid is formed preferably between the image plane and the optical end-position element. A substrate that is arranged in the image plane will in this case be wetted by the fluid.

With preference, an optical end-position element is used which is of a planar shape on the image side. This facilitates the formation of a fluid circulation without turbulence. The optical end-position element is configured in particular as a planar-parallel plate. Primarily in the case of a projection objective with an image-side numerical aperture>1, the optical end-position element can be configured as a planar-parallel plate which contiguously adjoins a planar surface of a planar-convex lens. The planar-parallel-plate in this arrangement can be connected to the planar-convex lens by means of a suitable adhesive compound, or it can be joined by wringing, i.e., rely on adhesive forces for the connection to the planar-convex lens. The planar-parallel plate can consist of the same material as the planar-convex lens, in which case it is also possible that the planar-convex lens and the planar-parallel plate are formed together as one part and a planar-parallel portion of the planar-convex lens is counted as belonging to the image-side-oriented part of the objective in the sense of the present invention. It is likewise possible that the planar-parallel plate consists of a material that is different from the planar-convex lens. This facilitates the adaptation of the image-side-oriented part of the objective to the fluid that is being used.

Suitable materials for the optical end-position element include for example quartz glass, calcium fluoride or barium fluoride.

In the different modes of operation of the projection objective, the optical end-position element can be designed differently in regard to at least one of the parameters that characterize its thickness, refractive index and image-side coating. The thickness is preferably measured by a thickness value at the center of the optical end-position element, which in the following will also be referred to as center thickness. The thickness is defined as the linear dimension parallel to an optical axis of the projection objective, wherein in the following the dimension of the optical end-position element is taken into consideration only insofar as it lies within the image-side-oriented part of the objective. Furthermore, the free space for the fluid can have a different thickness in each of the different modes of operation. In regard to the free space, the term "thickness" means for example the clear distance between the optical end-position element and the image plane, if the free space is delimited by the optical end-position element and the image plane. Accordingly, it is possible to use fluid layers of different thickness for the different modes of operation.

The optical end-position element and the fluid layer are matched to each other in particular in such a way that the sum of the respective multiplication products of the refractive index of the fluid and the thickness of the free space and of the refractive index and thickness of the optical end-position element—to the extent that the latter belongs to the image-side-oriented part of the objective—is at least approximately equal in the different modes of operation. Thus, the entire thickness of the optical end-position element is taken into consideration only if the optical end-position element is arranged completely within the image-side-oriented part of the objective. If this is not the case, only the thickness of that part of the optical end-position element is taken into consideration which lies within the image-side-oriented part of the objective. It may for example be specified in the design that the entire sum differs by less than 2% between the different modes of operation, and preferably by less than 1%. By matching the optical end-position element and the fluid to each other through these measures, the aperture error of the image-side-oriented part of the objective which is caused by the change to a fluid with a different refractive index can to a large extent be corrected. Accordingly when the projection objective is used in different modes of operation, the same object-side-oriented part of the objective can be used in spite of the different refractive indices of the fluids, possibly with minor changes or adjustments being required.

The image-side-oriented part of the objective is preferably configured in such a way that it is largely free of refractive power. A favorable combination of materials for the image-side-oriented part of the objective consists for example of an arrangement where in one operating mode of the projection objective the free space for the fluid is filled with water and the optical end-position element, to the extent that the latter belongs to the image-side-oriented part of the objective, is designed as a planar-parallel plate of quartz glass, and where in another operating mode the free space is filled with a fluid whose refractive index is greater than the refractive index of water and the optical end-position element is designed as a planar-parallel plate of calcium fluoride.

One can use different characteristic data of the image-side-oriented part of the objective to ensure that the image-side-oriented part of the objective is in each case configured for an operating mode with a desired fluid in such a way that the image-side-oriented part of the objective can be combined without problems with the same object-side-oriented part of the objective, possible with minor adaptations. For example, compatibility of the image-side-oriented part of the objective with the object-side-oriented part of the objective can be ensured through the property that the image-side-oriented part of the objective in the different operating modes has, if the image-side numerical aperture remains unchanged, an at least approximately equal amount of spherical aberration. One can in particular specify the requirement for the spherical aberration of the image-side-oriented part of the objective to differ by less than 5%, preferably less than 3%, and with special preference less than 1% in the different operating modes with the same image-side numerical aperture. The spherical aberration SPH of a planar-parallel plate or a planar-parallel fluid layer of the thickness d consisting of a material with the refractive index n can be calculated for a numerical aperture NA as follows:

$$SPH=d \cdot NA(n^2-1)/(2n^5)$$

The image-side-oriented part of the objective is configured preferably in such a way that it includes at least one planar-parallel plate and one planar-parallel fluid layer.

As a further condition, it is possible to specify that in the area of a reference surface that is formed between the object-side-oriented part of the objective and the image-side-oriented part of the objective, the height of the marginal ray of the bundle of rays through the center should differ by less than 2%, preferably by less than 1%, and with special preference by less than 0.5% in the different operating modes with the same image-side numerical aperture. As a further condition, it is possible to require for the optical path length difference between the principal ray and the marginal rays of the bundle through the center, measured from the reference surface to the image plane, to differ by less than 2%, preferably by less than 1%, and with special preference by less than 0.5% in the different operating modes. The term "optical path length of a ray" in this context means the sum of the respective multiplication products of refractive index and path length inside the optical elements traversed by the ray. For a planar-parallel plate (thickness d, material of refractive index n), the optical path length difference OPD between the principal ray and the marginal rays of the bundle through the center, with a numerical aperture NA, can be calculated by the formula $$OPD=d \cdot n(\sqrt{1-NA^2/n^2}-1)$$

With these conditions, an interface is defined between the object-side-oriented part of the objective and the image-side-oriented part of the objective which defines the properties in the area of the reference surface. If in a modification of the image-side-oriented part of the objective the thus defined properties of the interface are maintained, the capability of the image-side-oriented part of the objective to be combined with the object-side-oriented part of the objective is assured. The compatibility of the image-side-oriented part of the objective with the object-side-oriented part of the objective is important in particular for the reason that a vastly predominant portion of the optics of the projection objective is arranged in the object-side-oriented part of the objective, which makes the design and manufacture of the latter very complex and expensive. Thus, a change in the mode of operation of the projection objective requires only a comparatively small modification, and the manufacture of projection objectives for different modes of operation requires in each case only a comparatively small modification of the manufacturing process. Preferably, the projection objective according to the invention has at least approximately equal image-side numerical aperture values in the different modes of operation. The image-side numerical aperture is in particular at least 0.75.

In one example of an embodiment of the projection objective, a fluid for one mode of operation is specified with a refractive index that is smaller than the refractive index of one of the optical elements or of the optical end-position element, while for another mode of operation a fluid is specified with a refractive index that is larger than the refractive index of said optical element.

For one of the modes of operation of the projection objective, a fluid can be specified with a refractive index greater than 1.0, preferably greater than 1.3, and with special preference greater than 1.4. For example, water can be specified as the fluid for one mode of operation, whereby already a large depth of focus is achievable. Furthermore, in regard to its viscosity and chemical reactivity, water is well suited as an immersion fluid in projection objectives, and it is also already proven in practice. In order to achieve an even higher depth of focus, the preferred fluid in another mode of operation has a refractive index of more than 1.6. Refractive indices of this magnitude can be achieved for example with sulfuric acid or phosphoric acid.

In order to achieve the highest possible image quality with the projection objective, the object-side-oriented part of the objective can be configured differently in the different modes of operation. This means that an adaptation can be made in the object-side-oriented part of the objective for the individual modes of operation in order to achieve the best possible overall match. However, this adaptation is designed in a way that does not require extensive modifications in the object-side-oriented part of the objective. The object-side-oriented part of the objective can in particular be designed differently for the different operating modes in regard to at least one separation distance between neighboring optical elements. This requires only a small modification in the object-side-oriented part of the objective. This modification is particularly easy to perform if at least one of the optical elements whose separation distance is configured differently in the different operating modes is coupled to an adjustment device. In the latter case, the modification consists merely of a readjustment of the particular optical element.

It is also possible that the object-side-oriented part of the objective has at least one optical element which is different in regard to its shape in the different modes of operation. In the case of a lens, one can for example specify a different curvature radius or a differently shaped aspherical surface. With preference, the object-side-oriented part of the objective has a maximum of five optical elements that differ in regard to their shape between the different modes of operation. The optical element that differs in regard to its shape is preferably designed as an exchange part and arranged in the vicinity of the reference surface, an aperture plane or a conjugate aperture plane.

The projection objective can be designed for example as a purely refractive system with two contour bulges, in which the beam diameter of the light used to produce the image has two local maxima between the object plane and the image plane, with a local minimum lying in between the two local maxima. The area where the beam diameter has its minimum, i.e., where the beam is narrowed down between the two bulge-shaped wider sections is also referred to as the waist. Each of the further developed and variant versions described above can be combined with the design of the projection objective as a two-bulge system.

The projection objective can also be of a catadioptric design, wherein the object-side-oriented part of the objective produces more than one intermediate image. In this case, too, a combination is possible with the further developed and variant versions of the foregoing description.

The projection objective can have an image-side numerical aperture of at least as large as 1.2 and not exceeding an amount of 0.84 times the refractive index of the fluid. This design of the projection objective can be specified in combination with the further developed and variant versions described above.

The invention further includes a method of converting a projection objective. This method serves to reconfigure the projection objective from a first mode of operation to a second mode of operation by exchanging a first fluid which is contained in the free space of the image-side-oriented part of the objective and has a first refractive index against a second fluid which has a second refractive index different from the first refractive index. The method may further include an exchange and/or readjustment of the optical end-position element. The latter step serves for the previously described adaptation of the image-side-oriented part of the objective to the second fluid. In addition, after the changes have been made on the image-side-oriented part of the objective, the object-side-oriented part of the objective can be adjusted for compatibility with the image-side-oriented part of the objective. As described above, the latter operation can be performed in particular by a readjustment or exchange of individual optical elements of the object-side-oriented part of the objective. Likewise, everything else stated above in regard to the projection objective is analogously applicable to the method of converting the projection objective.

The scope of the method according to the invention can further include that at least one component of a fluid supply system which is designed for the first fluid is exchanged for a component that is designed for the second fluid. The component to be exchanged can in particular be a pump or a filter. An exchange of components of the fluid supply system can be required in particular if the fluids differ strongly from each other in regard to their physical or chemical properties. In the extreme case, the fluid supply system can be exchanged completely. If this kind of conversion is performed frequently, it is also possible that a plurality of components or fluid supply systems are permanently kept on stand-by and the exchange between them in a conversion is made by switching from one to the other.

In the method according to the invention for the manufacture of projection objectives, the projection objective is assembled by combining the object-side-oriented part of the objective with one of several embodiments of the image-side-oriented part of the objective which are adapted to different operating modes of the projection objective in which the free space is filled with fluids that differ in their respective indices of refraction. The foregoing explanations of the projection objective and of the method of converting the projection objective apply in each case analogously to the manufacturing method.

BRIEF DESCRIPTION OF THE DRAWING FIGURES

The invention is explained hereinafter in more detail with references to the examples illustrated in the drawings, wherein FIG. 1 represents a strongly simplified block diagram of an embodiment of a projection exposure apparatus;

DETAILED DESCRIPTION OF EXEMPLARY EMBODIMENTS

As used herein, the term fluid refers to and is restricted to a liquid as opposed to being a gas or the like.

Figure 1:
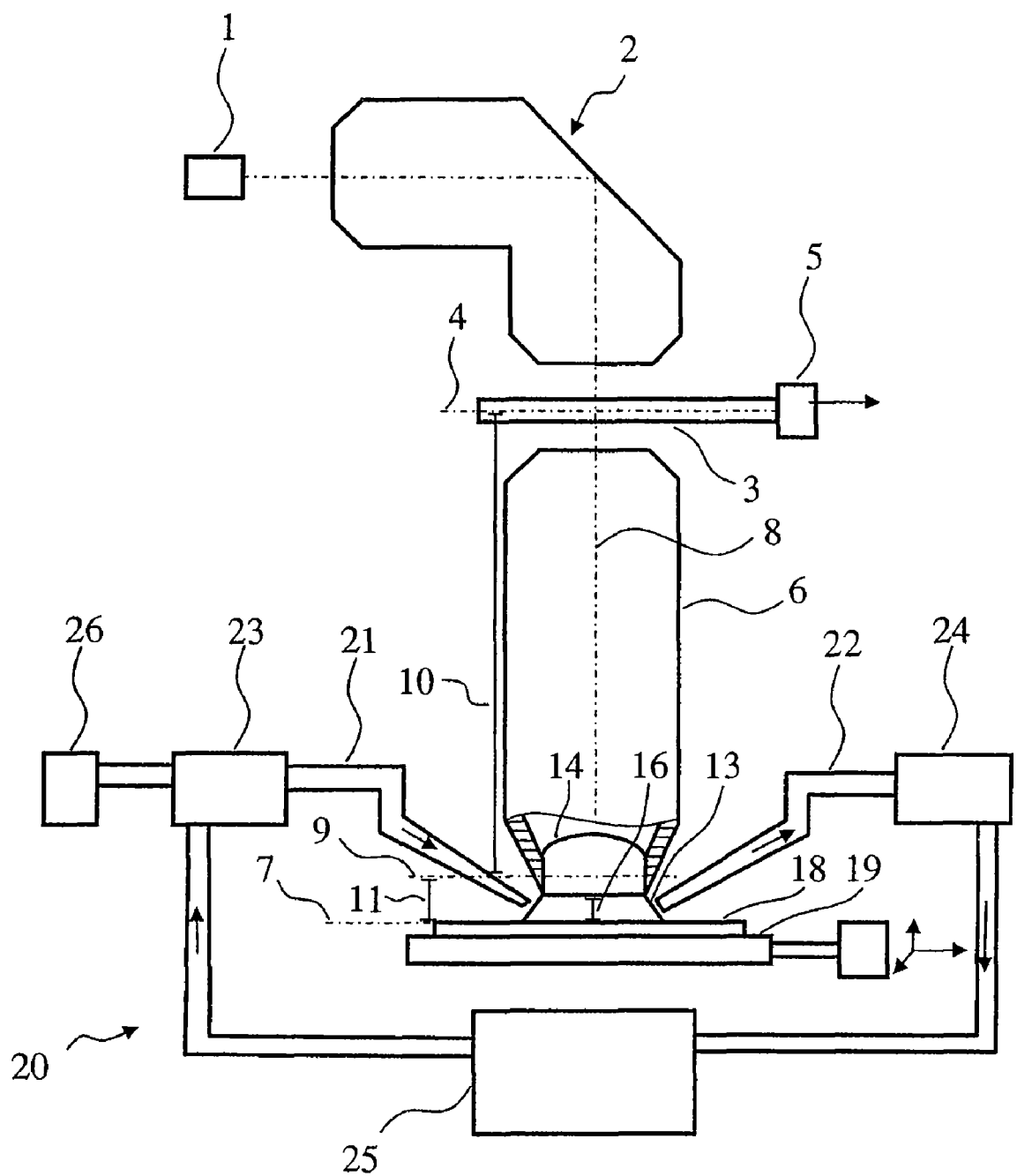

FIG. 1 shows a strongly simplified block diagram of an embodiment of a projection exposure apparatus. A projection exposure apparatus of this kind can be used for example in the manufacture of highly integrated semiconductor components.

The projection exposure apparatus includes a light source 1 which produces light of a wavelength preferably in the UV range or in the range of soft X-rays. As an example, the light source 1 can be an ArF excimer laser which emits light of a wavelength of 193 nm. However, other types of light sources 1 can also be used within the scope of the invention, such as for example an $F_2$ excimer laser with a wavelength of about 157 nm, a KrF excimer laser with a wavelength of 248 nm, etc., with preference being given to a wavelength of less than 250 nm. The projection exposure apparatus is designed to operate with light of a defined wavelength which in the following will be referred to as operating wavelength and which is equal to the wavelength produced by the light source 1.

The light produced by the light source 1 is directed to an illumination system 2. The illumination system 2 has the purpose to optimally illuminate a reticle, also referred to as a mask 3, which follows next in the light path after the illumination system and is arranged in an object plane 4. The illumination system 2 can for example be designed so that it produces in the object plane 4 a large, sharply delimited and very homogeneously illuminated illumination field. Depending on the requirements that it has to meet, the illumination system 2 can include devices to control the pupil illumination, to select an illumination mode, and in particular to set a desired state of polarization of the illumination light.

The reticle 3 is fastened to a handling device 5 which is also referred to as reticle stage and allows for example a lateral movement of the reticle 3 in a scanning mode of operation. By means of a projection objective 6 which follows next after the reticle 3, the structures formed on the reticle 3 are projected onto an image plane 7 which follows after the projection objective 6. The projection objective 6 extends along an optical axis 8, and in the illustrated embodiment, the projection objective 6 is centered relative to the optical axis 8. With a reference surface 9 oriented perpendicular to the optical axis 8, the projection objective 6 is subdivided into an object-side-oriented part 10 which is arranged adjacent to the object plane 4, and an image-side-oriented part 11 which is arranged adjacent to the image plane 7.

Figure 2:
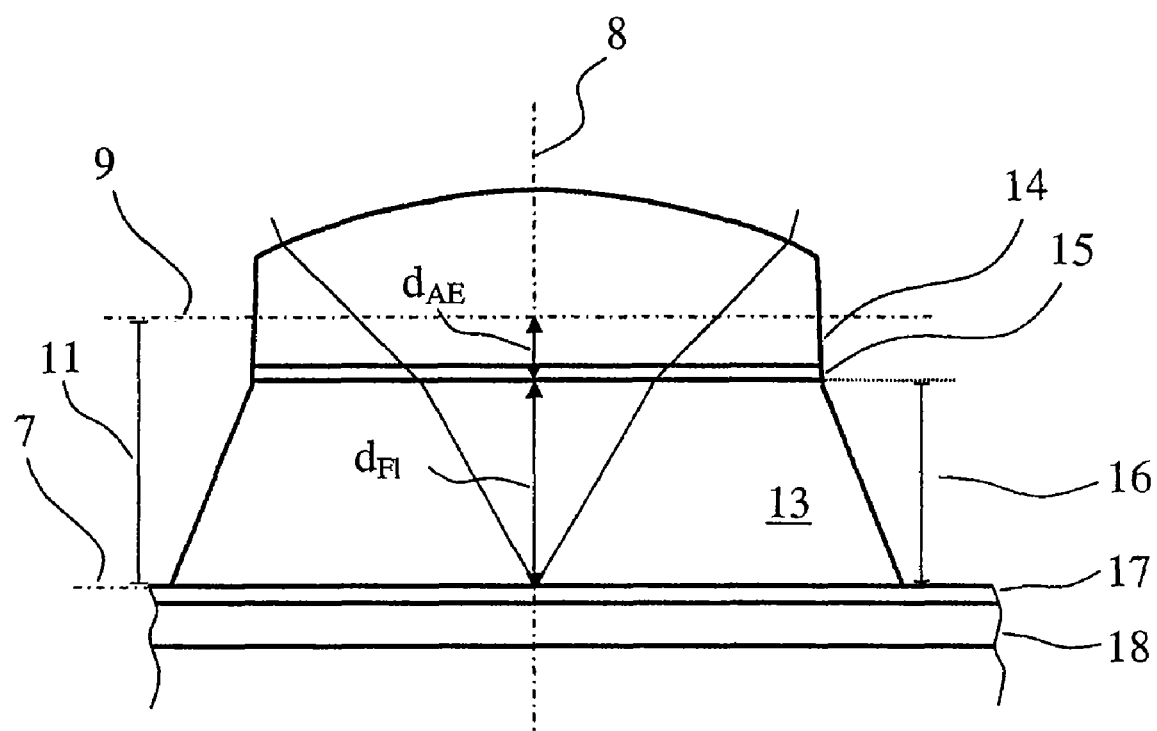
FIG. 2 represents an enlarged detail of FIG. 1 in the area of the image-side-oriented part of the objective.

The area of the image-side-oriented part 11 of the objective is shown in FIG. 2 as an enlarged detail. The image-side-oriented part 11 of the objective contains a fluid 13 with a refractive index $n_{Fl}$. The projection objective 6 has an optical end-position element 14 which has a refractive index $n_{AE}$ and is arranged at least in part in the area of the image-side-oriented part 11 of the objective where it is wetted by the fluid 13. In the illustrated embodiment, the optical end-position element 14 is configured as a planar-convex lens with a planar surface on the image side, with the reference surface 9 extending transversely through the planar-convex lens. Thus, only the part of the planar-convex lens that is on the image side of the reference surface 9 is part of the image-side-oriented part 11 of the objective. Although the planar-convex lens is counted only in part as belonging to the image-side-oriented part 11 of the objective, it can be made of one piece since the reference surface 9 does not represent a physical separation but only an imaginary surface which serves to facilitate the design of the projection objective 6. The optical end-position element 14 can also be configured as a planar-parallel plate. Preferred materials for the optical end-position element 14 include quartz glass, calcium fluoride, or barium fluoride. The design parameters in the example illustrated in FIGS. 1 and 2 are selected so that the refractive index $n_{Fl}$ of the fluid 13 is larger than the refractive index $n_{AE}$ of the optical end-position element 14.

The planar surface of the optical end-position element 14 is coated with a protective coating 15 which protects the optical end-position element 14 from the effects of the fluid 13. Dependent on the materials being used for the optical end-position element 14 and for the fluid 13, the protective layer 15 may also be omitted. At its center, the optical end-position element 14 has a dimension parallel to the optical axis 8 which is referred to as the center thickness. The center thickness is defined in analogous manner also for other components of the projection objective 6. Within the scope of the invention, the portion of the optical end-position element 14 which is located on the image side of the reference surface 9 and thus belongs to the image-side-oriented part 11 of the objective is of particular interest. The references to the center thickness of the optical end-position element 14 in the context of the invention refer to the part of the optical end-position element 14 that is located on the image side of the reference surface 9. The abbreviation $d_{AE}$ is used as a symbol for the center thickness of the optical end-position element that is defined in this way.

Between the optical end-position element 14 and the image plane 7 there is a free space 16 that is filled with the fluid 13. The free space 16 has a center thickness $d_{Fl}$ and will in the further description be counted as belonging to the image-side-oriented part 11 of the objective, so that the image-side-oriented part 11 of the objective extends out to the image plane 7. The free space 16 is delimited on the image side by a light-sensitive coating 17 of a substrate 18. The light-sensitive coating 17, also called resist and consisting for example of a photo-sensitive lacquer, is wetted by the fluid 13. The substrate 18 is for example a wafer, in particular a silicon wafer.

The substrate 18 is arranged on a handling device 19 which is also referred to as wafer stage and which can be moved and adjusted in a multitude of ways. For example, the substrate 18 can be moved perpendicular to the optical axis 8 by means of the handling device 19, performing in particular a movement that is synchronous and anti-parallel to a movement of the reticle 3. The handling device 19 further allows a movement of the substrate 18 parallel to the optical axis 8 and a tilting movement about at least one tilt axis. This makes it possible that the light-sensitive coating 17 of the substrate 18 can be positioned exactly in the image plane 7 of the projection objective 6.

A fluid supply system 20 is provided for the purpose of setting up a layer of fluid between the optical end-position element 14 and the substrate 18. The fluid supply system 20 has at least one inlet conduit 21 through which the fluid 13 can flow into the free space 16, and at least one outlet conduit 22 through which the fluid 13 can flow out of the free space 16. The inlet conduit 21 and the outlet conduit 22 are preferably arranged laterally on opposite sides. The inlet conduit 21 is connected to a metering device 23 which regulates the inflow of fluid into the free space 16. The outlet conduit 22 is connected to a suction device 24 to pull the fluid 13 out of the free space 16. The metering device 23 and the suction device 24 are connected to each other through a cleaning station 25, for example in the form of a filter, a distillation apparatus or a chromatography column, so that the fluid 13 which has been removed from the free space 16 through the outlet conduit 22 can be returned to the free space 16 again through the inlet conduit 21. If a continuous cleaning of the fluid 13 is not necessary, the cleaning station 25 can be bypassed during at least part of the time. Furthermore, a reservoir 26 is provided to store the fluid 13. The reservoir 26 is connected to the metering device 23 and can for example serve to compensate for fluid losses or to introduce new fluid 13 in an exchange of the fluid 13.

The fluid supply system 20 further includes a control device and a diversity of measuring devices which are not graphically represented. They serve to continuously monitor the status of the fluid 13 and to control the fluid flow in such a way that the optical properties of the fluid 13 are optimized in the best possible way.

During operation of the projection exposure apparatus, there is a continuous flow of fluid 13 through the free space 16 between the optical end-position element 14 and the substrate 18, with the fluid 13 being pumped through the inlet conduit 21 into the free space 16 and suctioned off from the free space 16 through the outlet conduit 22. In this way, a fluid layer with defined optical properties is formed between the optical end-position element 14 and the substrate 18. When the fluid layer has been built up, the projection objective 6 is ready to operate and projects an image of the reticle 3 illuminated by the illumination system 2 onto the light-sensitive coating 17 of the substrate 18, with the fluid 13 serving as immersion fluid. After the substrate 18 has been exposed in this way, it is subjected to a processing treatment for the structures that were produced by the exposure. Subsequently, further exposures and further processing treatments can take place. This procedure is continued until the substrate 18 has received all of the desired structures.

The imaging properties of the projection objective 6 depend, among other things, on the optical properties of the fluid 13, in particular on the refractive index $n_{Fl}$ of the latter. For example, a higher refractive index $n_{Fl}$ allows a higher depth of focus to be achieved with the same image-side numerical aperture. The scope of the invention includes the possibility to operate the projection objective 6 with a desired fluid 13. This is accomplished by adapting the image-side-oriented part 11 of the objective to the desired fluid 13 without any changes or with only insignificant changes in the object-side-oriented part 10 of the objective which is of a substantially more complex design. The adaptations are made already in the manufacture of the projection objective 6 for a desired fluid 13 or in the context of a later conversion of the projection objective 6 to another fluid 13. The invention is described hereinafter for the case of a later conversion of the projection objective 6 to another fluid 13. In the manufacture of the projection objective 6, an analogous thought process is required and consequently, no description is presented here in specific reference to the manufacturing process.

In order to be able to leave the object-side-oriented part 10 of the objective as much as possible unchanged in the conversion of the projection objective 6 to another fluid 13, the reference surface 9 between the object-side-oriented part 10 and the image-side-oriented part 11 is considered as an interface where the change caused by the conversion should be as small as possible. The closer one can come to meeting this requirement, the less it will be necessary to make modifications in the object-side-oriented part 10 of the objective. Nevertheless, exchanging the previously used fluid 13 against a different fluid 13 which has a different refractive index $n_{Fl}$ represents at first a major disturbance. This disturbance needs to be compensated now in the image-side-oriented part 11 of the objective in such a way that the effect which the disturbance has in the area of the reference surface 9 is as small as possible. In other words, the aperture error caused by the change of the fluid 13 needs to be compensated as accurately as possible within the image-side-oriented part 11 of the objective. This condition is met if, with the same image-side aperture, the marginal ray height in the area of the reference surface 9 as well as the spherical aberration have as accurately as possible the same respective values as before the conversion. This can be stated in quantitative terms by specifying the allowable maxima for the respective deviations between the values before and after the conversion. The relative deviation of the marginal ray height should not exceed a value of 2%, preferably 1%, and with special preference 0.5%. The marginal ray height is defined as the distance of a marginal ray that belongs to a light bundle through the center measured at a right angle to the optical axis 8 at the location of the reference surface 9. The marginal rays are distinguished in that they pass through a system aperture stop of the projection objective 6 just touching the border of the latter. The term "light bundle through the center" refers to light rays that originate from the reticle 3 at a location near the optical axis 8. The maximum value for the relative deviation of the spherical aberration is 5%, preferably 3%, and with special preference 1%. Furthermore, the relative deviation of the optical path difference between the principal ray and the marginal rays of the light bundle through the center from the reference surface to the image plane should be less than 2%, preferably less than 1%, and with special preference less than 0.5%. The image-side numerical aperture is preferably larger than 1.0. The principal ray of the light bundle through the center is distinguished in that it passes through the system aperture stop of the projection objective 6 on the optical axis 8.

The adaptation of the image-side-oriented part 11 of the objective to the fluid 13 can be accomplished in particular by way of the optical end-position element 14. To achieve this purpose, the optical end-position element 14 can be moved parallel to the optical axis 8, which affects the center thickness $d_{Fl}$ of the fluid layer among other things. Likewise, the previously used optical end-position element 14 can be removed, and in its place another optical end-position element can be installed which has a different center thickness $D_{AE}$ and/or is made of a different material. These changes in the optical end-position element 14 are made in particular in such a way that as a new optical end-position element 14, a planar-parallel plate consisting in particular of a different material is installed and the center thickness $d_{AE}$ of the previously used optical end-position element 14 is reduced. The optical end-position element 14 is further adapted to the fluid 13 in regard to the protective coating 15, meaning that a protective coating 15 is applied which is matched to the fluid 13, or that an existing protective coating 15 is removed if it is no longer needed for the now substituted fluid 13 and has an undesirable effect.

A good adaptation of the image-side-oriented part 11 of the objective is normally accomplished if the expression $$\text{SUM} = d_{FL} \cdot n_{Fl} + d_{AE} \cdot n_{AE}$$

has about the same numerical value before and after the conversion. Given that the choice of available materials and the possible thickness ranges are limited, this optimization does not involve a major effort. The relative deviation between the values for the expression SUM before and after the conversion should be less than 2%, preferably less than 1.

If the desired image quality cannot be achieved with the adaptation of the image-side-oriented part 11 of the objective, one can in addition take adaptive measures in the object-side-oriented part 10 of the objective. Adaptive measures that can be considered include the change of separation distances between neighboring optical elements or also the change of the outside shape of optical elements. This can be facilitated by adjustment devices or by providing for a simple way of interchanging the affected optical elements, where in particular the optical elements near the reference surface 9 or near and aperture plane or a conjugate aperture plane can be considered for an exchange.

In addition to changes in the optics of the projection objective 6, it is also possible to make changes in the fluid supply system 20 in order to optimize the operation with the new fluid 13 as much as possible. In particular, one could exchange components of the fluid supply system 20 or the entire fluid supply system 20.

In the following discussion of several embodiments of the projection objective 6, two design variants with the same image-side numerical aperture will be described for each embodiment, in which fluids 13 with different refractive indices $n_{Fl}$ are used, with the first design variant of each embodiment being adapted to water as immersion fluid and the second design variant being adapted to an immersion fluid of a high refractive index. These embodiments allow the possibility to select the desired fluid 13 and the respective adapted design variant in the manufacture of the projection objective 6, or to later convert the projection objective 6 to a desired fluid and to adapt the design accordingly.

Figure 3:
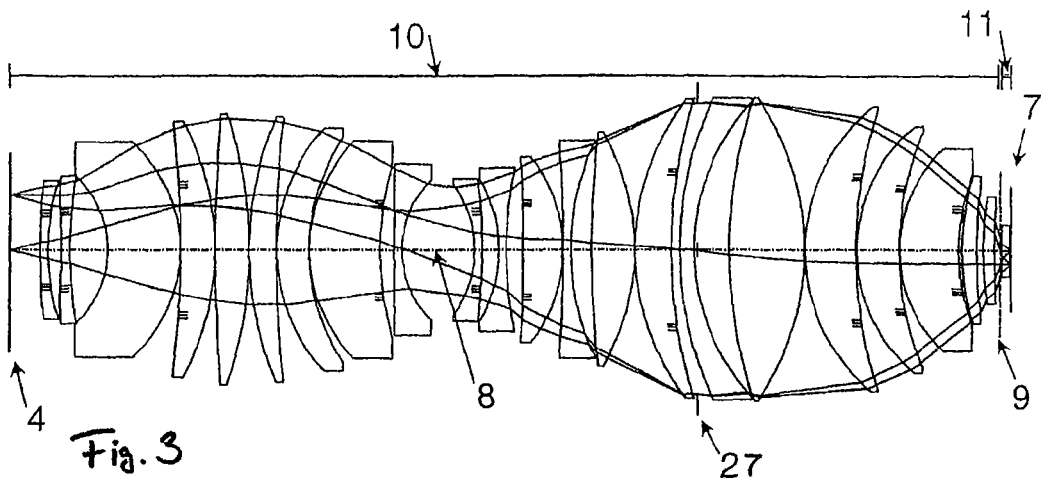
FIG. 3 represents a variant design version which is adapted to water as an immersion fluid for a first embodiment of the projection objective in a meridian section.
Figure 4:
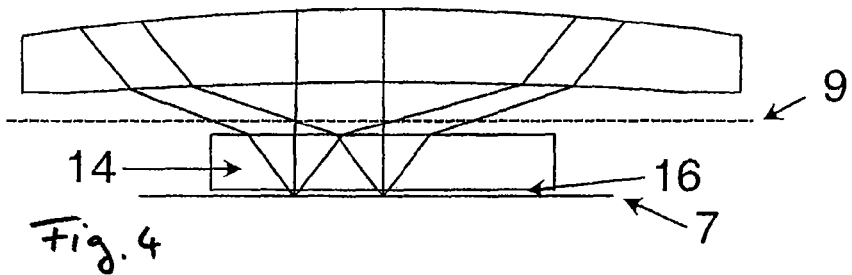
FIG. 4 represents an enlarged detail of FIG. 3 in the area of the image-side-oriented part of the objective.

FIG. 3 represents a design variant of a first embodiment of the projection objective 6 which is adapted to water as an immersion fluid, illustrated in a meridian section. An enlarged detail in the area of the image-side-oriented part 11 of the objective is shown in FIG. 4. The respective design data are listed in Tables 1 and 2. The first row of Table 1 contains data regarding the image-side numerical aperture NA, the height Y' of the image field, and the operating wavelength λ. The height Y' of the image field indicates the maximum distance from the optical axis 8 within the image field that is produced on the substrate 18 by the image-projection of the projection objective 6. The column with the heading "SURFACE" in Table 1 indicates the position numbers of the optical surfaces starting from the object plane 4, the column with the heading "RADIUS" lists the curvature radius of each optical surface in mm, the column with the heading "THICKNESS" lists the distance of each surface to the next following surface measured along the optical axis in mm, the column with the heading "MATERIAL" lists the material of the element to which the respective optical surface belongs, and the column with the heading "SEMIDIAM." lists the radius of the optically usable area of the respective optical element in mm. A further column contains other information, in particular a note on whether the respective optical surface is of an aspherical shape. The aspheric constants for the aspherical optical surfaces are listed in Table 2. In FIG. 3, each of the aspherical surfaces is identified as such by a group of short dashes. Also indicated in FIG. 3 is an aperture stop 27. The data for the design variants that follow are presented in analogously structured tables and the aspherical surfaces are identified in the same manner.

The first embodiment of the projection objective 6 is a purely refractive two-bulge system with two bulge-shaped expansions of the light beam and a waist-shaped constriction of the light beam in between. The first embodiment is designed for an operating wavelength of 193 nm. The image-side numerical aperture is NA=0.95. In the design variant illustrated in FIGS. 3 and 4, the projection objective has optical elements consisting exclusively of quartz glass (fused silica) with a refractive index n=1.56, wherein the optical end-position element 14 is configured as a planar-parallel plate of quartz glass. The immersion fluid to fill the free space 16 in this design variant is water, which has a refractive index of 1.43.

Figure 5:
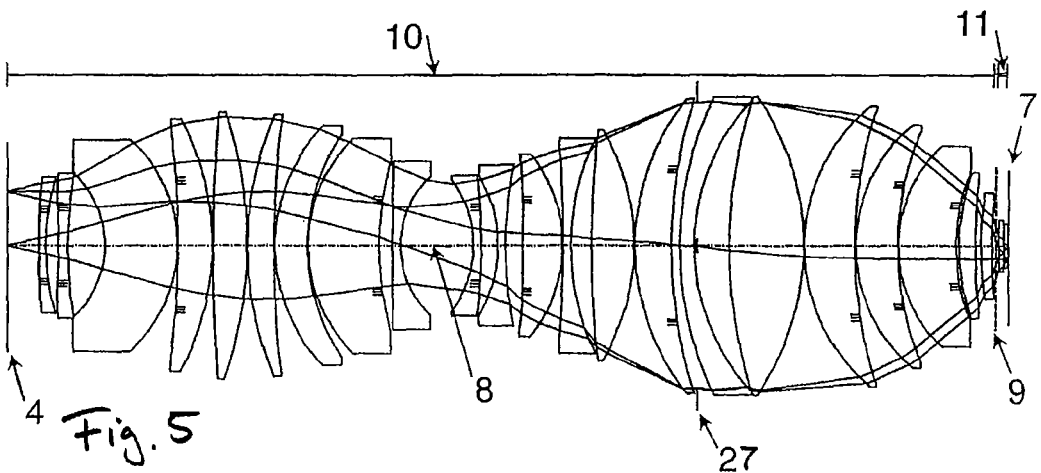
FIG. 5 represents a variant design version which is adapted to an immersion fluid with a high refractive index for the first embodiment of the projection objective in a meridian section.
Figure 6:
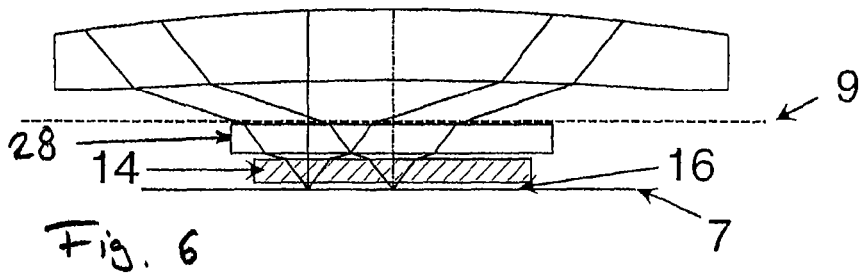
FIG. 6 represents an enlarged detail of FIG. 5 in the area of the image-side-oriented part of the objective.

FIG. 5 represents a design variant of the first embodiment of the projection objective 6 which is adapted to an immersion fluid with a high refractive index, shown in a meridian section. An enlarged detail in the area of the image-side-oriented part 11 of the objective is shown in FIG. 6. The respective design data are listed in Tables 3 and 4.

The operating wavelength and the numerical aperture are unchanged in relation to FIGS. 3 and 4. In the place of water, an immersion fluid with a high refractive index of $n_{FI}$=1.65 is used. A refractive index of this magnitude can be realized for example with sulfuric or phosphoric acid. The same applies to the further embodiments of the projection objective 6. To adapt the projection objective 6 to the changed refractive index, modifications were made in the image-side-oriented part 11 of the objective. In contrast, the object-side-oriented part 10 of the objective was kept unchanged. The changes can be seen by comparing Tables 1 and 3. As an optical end-position element 14, a planar-parallel plate of calcium fluoride is used in this case. Adjacent on the object side of the optical end-position element 14 is an intermediate optical element 28 which is configured as a planar-parallel plate of quartz glass and represents a new addition in comparison with FIGS. 3 and 4. The adaptation measures furthermore also include adapting the positions of the optical end-position element 14 and the intermediate optical element 28 in a direction parallel to the optical axis 8 of the projection objective 6. This has for example the result of an increased distance of the optical end-position element 14 from the image plane 7, i.e., a thicker fluid layer, in comparison to FIGS. 3 and 4.

After the image-side-oriented part 11 of the objective has been modified in this manner, it can be used in combination with the object-side-oriented part 10 which is kept unchanged from FIG. 3. Thus, in the first embodiment of the projection objective 6, no change of the object-side-oriented part 10 of the objective is required for the conversion from water to the immersion fluid with the high index of refraction. The quality of the adaptation to the high-refraction immersion fluid can be seen in Table 13, where for the operation of the projection objective 6 with water and for operation of the converted objective 6 with the immersion fluid of a high refractive index the respective values are listed for the expression SUM, for the marginal ray height RSH, the optical path length difference OPD between the principal ray and the marginal rays, and the spherical aberration SPH. The values are stated in millimeters. In addition, the differences in % are shown between the respective values before and after the conversion. The table also contains the corresponding values for further embodiments of the projection objective 6.

Figure 7:
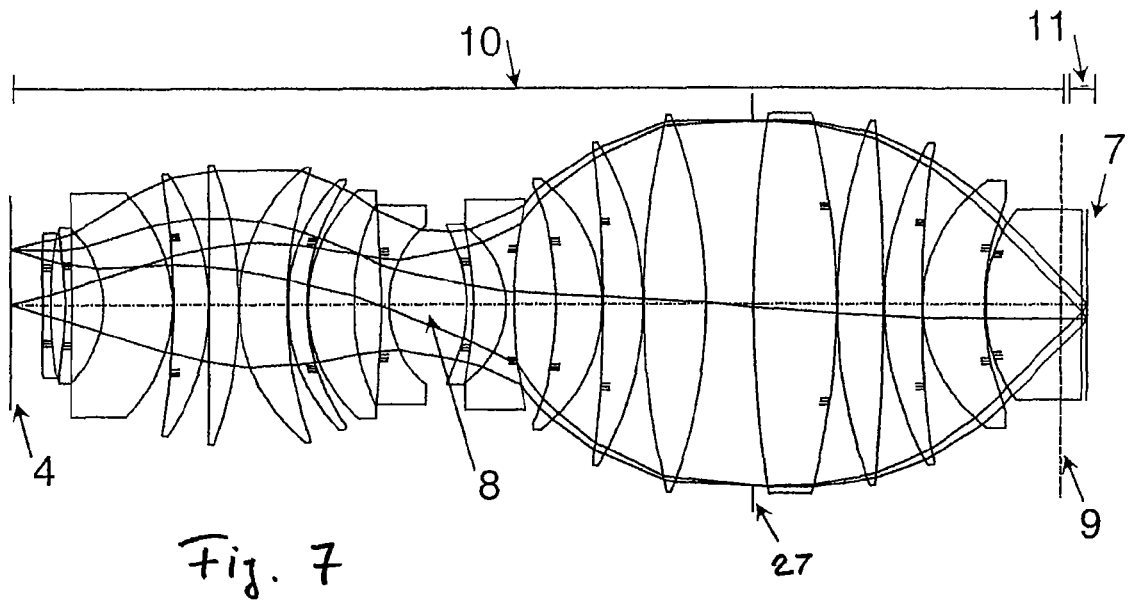
FIG. 7 represents a variant design version which is adapted to water as an immersion fluid for a second embodiment of the projection objective in a meridian section.
Figure 8:
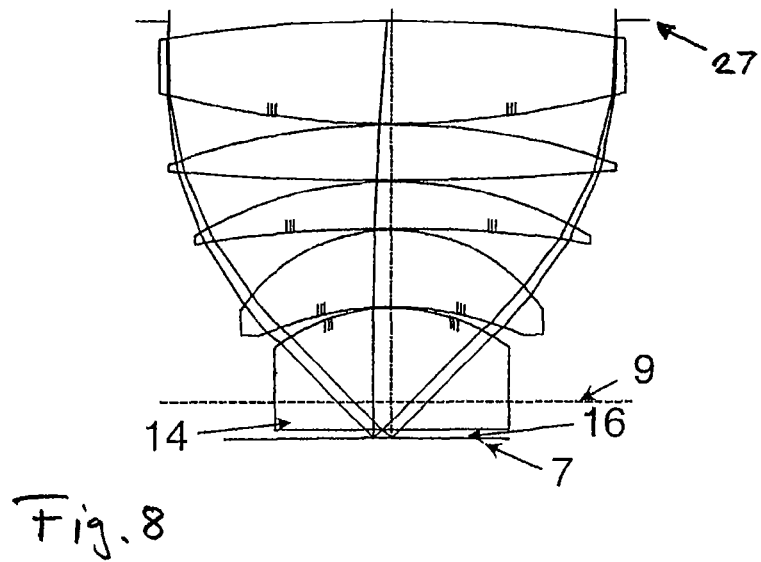
FIG. 8 represents an enlarged detail of FIG. 7 in the area of the image-side-oriented part of the objective.

FIG. 7 represents a design variant of a second embodiment of the projection objective 6 which is adapted to water as an immersion fluid, illustrated in a meridian section. An enlarged detail in the area of the image-side-oriented part 11 of the objective is shown in FIG. 8. The respective design data are listed in Tables 5 and 6.

Like the first embodiment of the projection objective 6, the second embodiment is designed for an operating wavelength of 193 nm and configured as a purely refractive two-bulge system. However the image-side numerical aperture is larger than in the first embodiment, amounting to NA=1.1. In the design variant illustrated in FIGS. 7 and 8, the projection objective has optical elements consisting exclusively of quartz glass and is designed to be operated with water as immersion fluid. For the optical end-position element 14, a planar-convex lens is used which is arranged in part in the area of the image-side-oriented part 11 of the objective and has its planar surface on the image side. Similar to the first embodiment, the second embodiment likewise offers the possibility of conversion to a different immersion fluid.

Figure 9:
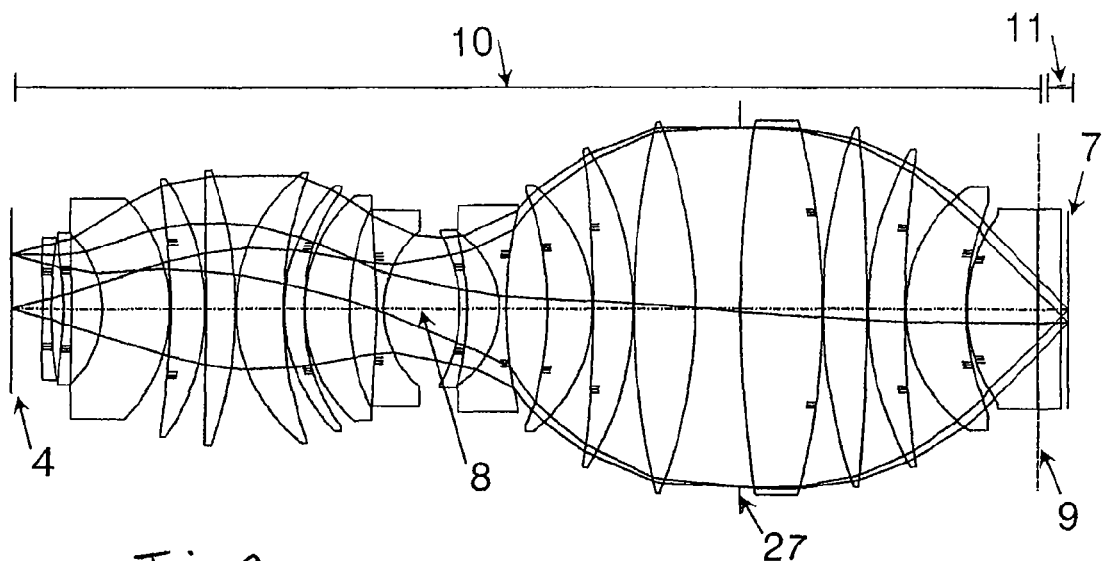
FIG. 9 represents a variant design version which is adapted to the immersion fluid with the high refractive index for the second embodiment of the projection objective in a meridian section.
Figure 10:
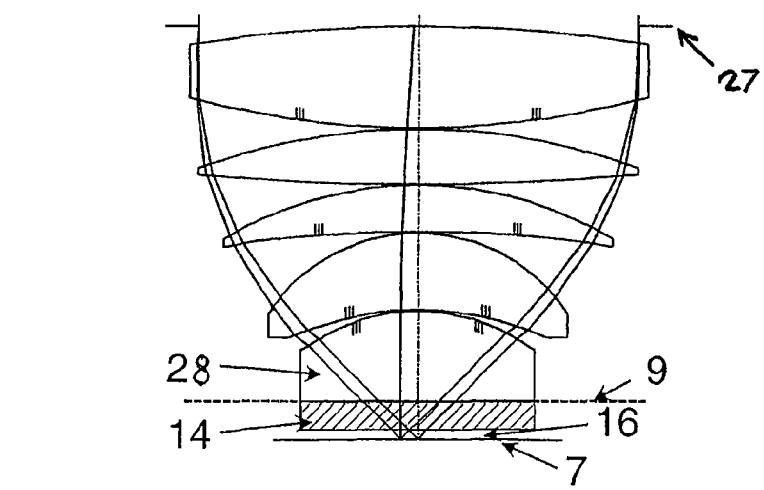
FIG. 10 represents an enlarged detail of FIG. 9 in the area of the image-side-oriented part of the objective.

FIG. 9 represents a design variant of the second embodiment of the projection objective 6 which is adapted to an immersion fluid with a high refractive index, shown in a meridian section. An enlarged detail in the area of the image-side-oriented part 11 of the objective is shown in FIG. 10. The respective design data are listed in Tables 7 and 8. The parameters for the conversion are listed in Table 13.

With the operating wavelength and the numerical aperture remaining unchanged in relation to FIGS. 7 and 8, an immersion fluid with a high refractive index of $n_{FI}$=1.65 is used instead of water. To adapt the projection objective 6 to the immersion fluid with the high refractive index, the optical end-position element 14 is replaced by a combination of a planar-parallel plate of calcium fluoride and a planar-convex lens of quartz glass. Now, the planar-parallel plate serves as the optical end-position element 14, and the planar-convex lens is arranged as an intermediate optical element 28 on the object side immediately adjacent to the optical end-position element 14. The clearance distance of the optical end-position element 14 from the image plane 7 is larger than in FIGS. 7 and 8, so that there is a thicker layer of fluid.

However, the previously described modifications of the image-side-oriented part 11 of the objective are not sufficient in the second embodiment, but additional adaptation measures are needed on the object-side-oriented part 10 of the objective. Still, these adaptation measures can be limited to the optical elements on the image side of the aperture stop 27, i.e. to the end portion towards the image side of the object-side-oriented part 10. Among these adaptation measures, the clearance distances are changed between adjacent optical elements. In addition, the aspherical constants are changed in some aspherically configured optical elements. Details can be seen in Tables 7 and 8, in particular by a comparison with Tables 5 and 6. Insofar as the adaptation measures relate to changes of the clearance distances between adjacent optical elements, it is possible to provide a possibility for changing the position parallel to the optical axis 8 of each of the elements that need to be moved. To change the aspherical constant, it is in each case necessary to uninstall the respective optical element, so that it can be reworked or replaced. These elements are therefore preferably mounted in such a way that they are easy to exchange.

Figure 11:
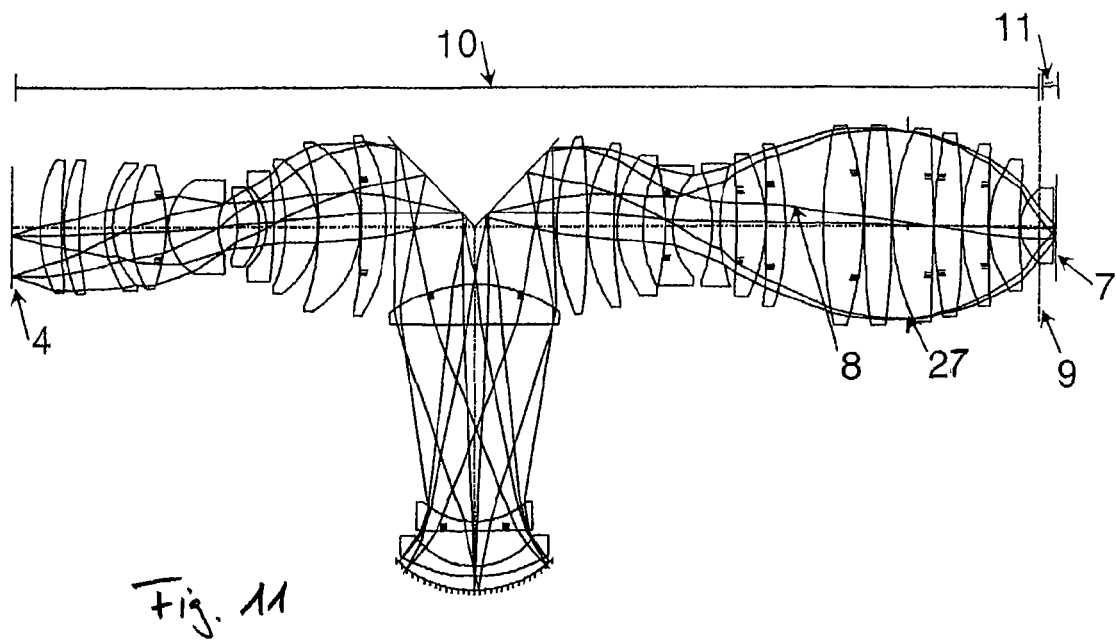
FIG. 11 represents a variant design version which is adapted to water as an immersion fluid for a third embodiment of the projection objective in a meridian section.
Figure 12:
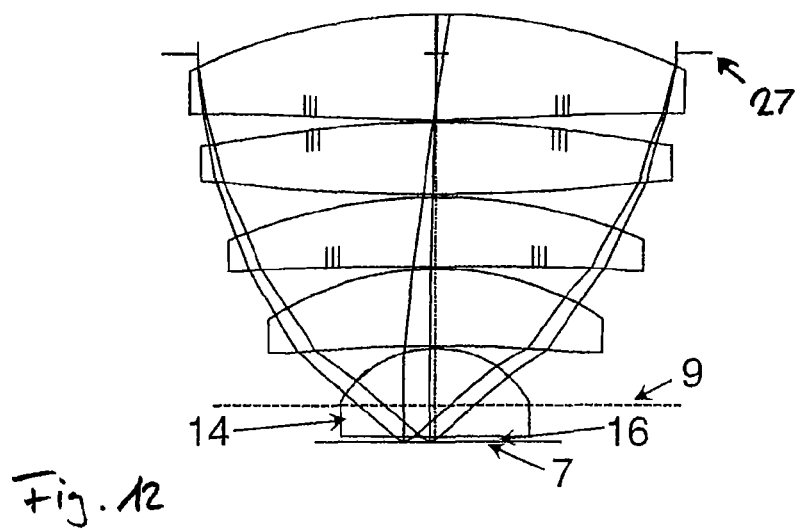
FIG. 12 represents an enlarged detail of FIG. 11 in the area of the image-side-oriented part of the objective.

FIG. 11 represents a design variant of a third embodiment of the projection objective 6 which is adapted to water as an immersion fluid, illustrated in a meridian section. An enlarged detail in the area of the image-side-oriented part 11 of the objective is shown in FIG. 12. The respective design data are listed in Tables 9 and 10.

The third embodiment of the projection objective 6 is designed likewise for an operating wavelength of 193 nm. However, in contrast to the first and second embodiments, the third embodiment is not configured as a purely refractive, but as a catadioptric system, wherein the object-side-oriented part 10 of the objective produces two intermediate images. All of the refractive optical elements are made of quartz glass. The image-side numerical aperture is NA=1.2. Water is used as immersion fluid in the design variant shown in FIGS. 11 and 12. Similar to the second embodiment, the third embodiment likewise has an optical end-position element 14 configured as a planar-convex lens with a planar surface on the image side and is arranged in part in the image-side-oriented part 11 of the objective.

Figure 13:
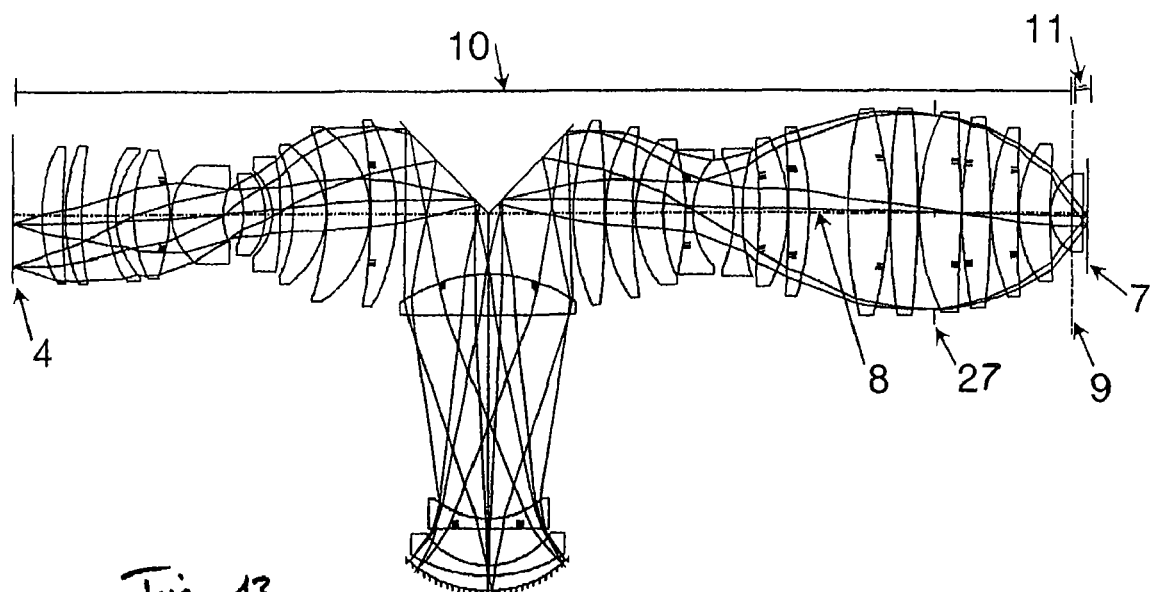
FIG. 13 represents a variant design version which is adapted to the immersion fluid with the high refractive index for the third embodiment of the projection objective in a meridian section.
Figure 14:
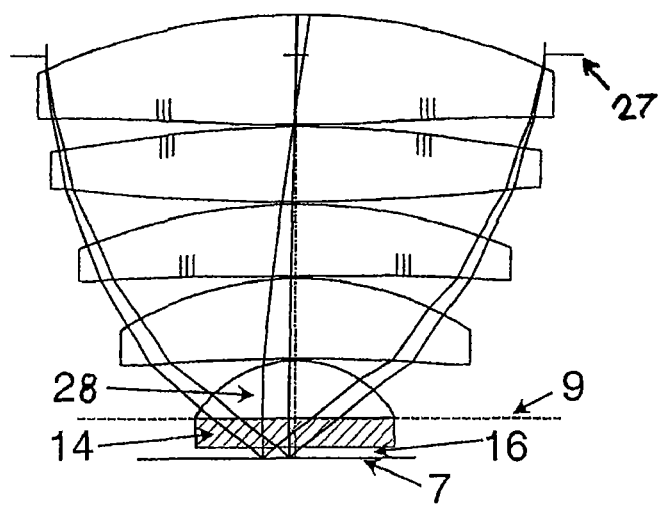
FIG. 14 represents an enlarged detail of FIG. 13 in the area of the image-side-oriented part of the objective.

FIG. 13 represents a design variant of the third embodiment of the projection objective 6 which is adapted to an immersion fluid with a high refractive index, shown in a meridian section. An enlarged detail in the area of the image-side-oriented part 11 of the objective is shown in FIG. 14. The respective design data are listed in Tables 11 and 12. The parameters for the conversion are listed in Table 13.

The operating wavelength and the numerical aperture remain unchanged in relation to FIGS. 11 and 12. Instead of water, the immersion fluid with a high refractive index of $n_{Fl}$=1.65 is used. Similar to the second embodiment, the optical end-position element 14 is configured as a planar-parallel plate of calcium fluoride, and immediately adjacent to the object side of the optical end-position element 14 there is an intermediate optical element 28 configured as a planar-convex lens of quartz glass. The center thickness $d_{Fl}$ of the fluid layer is larger than in FIGS. 11 and 12. Besides these adaptations of the image-side-oriented part 11 of the objective, the object-side-oriented part 10 of the objective is likewise modified relative to FIG. 11, wherein the changes are again limited to the end portion on the image side of the object-side-oriented part 10 and are only affecting optical elements on the image side of the aperture stop 27. The modifications are of a comparable nature as has been described for the second embodiment. Details regarding the changes can be seen by comparing Tables 11 and 12 to Tables 9 and 10.

The design variants described hereinabove for the projection objective 6 represent only a small selection of possible designs which can be made for different fluids 13 without major modification efforts. The range of fluids is not limited to water and to the aforementioned immersion fluid with a high refractive index but includes in principle any other fluids 13 that are suitable as immersion fluids. Likewise, there is no limit to the number of possible fluids 13 to which a design can be adapted.

TABLE 1

NA = 0.95, Y' = 14.02 mm, λ = 193 nm

| SURFACE | RADIUS | THICKNESS | MATERIAL | SEMIDIAM. | |
|---|---|---|---|---|---|
| OBJECT | INFINITY | 31.9999 | | 56.08 | |
| 1 | 57573.384314 | 8.0000 | SIO2 | 64.47 | ASPHERE |
| 2 | 243.810838 | 13.2707 | | 66.13 | |
| 3 | −1090.143042 | 9.3540 | SIO2 | 67.42 | ASPHERE |
| 4 | 466.145521 | 37.5471 | | 70.64 | |
| 5 | −105.489077 | 75.0000 | SIO2 | 72.25 | |
| 6 | −148.914172 | 0.5855 | | 107.44 | |
| 7 | −934.566511 | 36.2435 | SIO2 | 123.61 | ASPHERE |
| 8 | −274.035276 | 0.6116 | | 127.26 | |
| 9 | 1877.003491 | 35.1457 | SIO2 | 133.59 | |
| 10 | −433.158396 | 0.6411 | | 134.34 | |
| 11 | 340.473694 | 28.3403 | SIO2 | 131.81 | |
| 12 | 1177.957955 | 0.9582 | | 130.18 | |
| 13 | 180.584787 | 34.5615 | SIO2 | 121.25 | |
| 14 | 206.758154 | 0.5010 | | 112.12 | |
| 15 | 155.938957 | 75.0000 | SIO2 | 108.37 | |
| 16 | 281.771324 | 15.0536 | | 85.61 | ASPHERE |
| 17 | 15953.615671 | 8.0000 | SIO2 | 83.06 | |
| 18 | 98.431585 | 77.0419 | | 68.55 | |
| 19 | −111.308146 | 8.0193 | SIO2 | 64.26 | |
| 20 | −702.509172 | 18.0835 | | 68.14 | ASPHERE |
| 21 | −138.076465 | 8.3622 | SIO2 | 68.73 | |
| 22 | 416.972180 | 18.5234 | | 79.11 | |
| 23 | −11234.170087 | 41.8736 | SIO2 | 85.07 | ASPHERE |
| 24 | −150.892964 | 0.8082 | | 91.33 | |
| 25 | −1297.100948 | 8.0000 | SIO2 | 99.81 | |
| 26 | 253.311103 | 21.8807 | | 107.73 | |
| 27 | 1068.916725 | 45.0713 | SIO2 | 111.68 | |
| 28 | −236.444857 | 0.5000 | | 115.81 | |
| 29 | 244.447627 | 38.4473 | SIO2 | 149.24 | |
| 30 | 557.459687 | 26.8178 | | 148.57 | ASPHERE |
| 31 | INFINITY | −18.1738 | | 148.93 | APERTURE STOP |
| 32 | 360.543724 | 15.0000 | SIO2 | 150.98 | |

TABLE 1-continued

NA = 0.95, Y' = 14.02 mm, λ = 193 nm

| SURFACE | RADIUS | THICKNESS | MATERIAL | SEMIDIAM. | |
|---|---|---|---|---|---|
| 33 | 221.880515 | 36.5144 | | 147.91 | |
| 34 | 488.300751 | 77.1255 | SIO2 | 149.90 | |
| 35 | −279.914925 | 0.5220 | | 151.49 | |
| 36 | 187.875575 | 53.2248 | SIO2 | 142.93 | |
| 37 | 489.306568 | 0.9446 | | 139.20 | ASPHERE |
| 38 | 163.274968 | 44.1943 | SIO2 | 123.33 | |
| 39 | 325.397565 | 0.4997 | | 116.17 | ASPHERE |
| 40 | 140.866290 | 60.7172 | SIO2 | 100.50 | |
| 41 | 235.723786 | 2.9779 | | 73.26 | ASPHERE |
| 42 | 232.815045 | 16.6707 | SIO2 | 71.37 | |
| 43 | 582.776739 | 6.7517 | | 64.00 | |
| 44 | 375.408256 | 11.2935 | SIO2 | 50.14 | |
| 45 | 687.655215 | 7.0754 | | 42.35 | |
| 46 | INFINITY | 0.998 | | 24.53 | REFERENCE SURF. |
| 47 | INFINITY | 8.4995 | SIO2 | 21.44 | |
| 48 | INFINITY | 1.0000 | H2O | 14.90 | |
| IMAGE | INFINITY | | | 14.02 | |

TABLE 2

| | SRF | | | | |
|---|---|---|---|---|---|
| | 1 | 3 | 7 | 16 | 20 |
| K | 0 | 0 | 0 | 0 | 0 |
| C1 | 2.187157E−07 | 2.909419E−08 | −1.506913E−09 | −3.774747E−08 | −1.136180E−09 |
| C2 | −2.487757E−11 | 1.261210E−11 | 2.120740E−13 | 1.140271E−12 | −3.091171E−12 |
| C3 | 1.853585E−15 | −1.055565E−15 | 5.182820E−18 | 2.928811E−17 | −5.711004E−16 |
| C4 | −1.617589E−19 | 3.623046E−20 | 2.163295E−23 | −5.477432E−21 | 2.509741E−20 |
| C5 | 1.923071E−24 | 8.424309E−24 | −5.163241E−27 | 1.585045E−25 | 2.710175E−24 |
| C6 | 5.473790E−29 | −4.162924E−28 | 3.339083E−32 | 7.346294E−30 | −2.322363E−28 |

| | SRF | | | | |
|---|---|---|---|---|---|
| | 23 | 30 | 37 | 39 | 41 |
| K | 0 | 0 | 0 | 0 | 0 |
| C1 | −6.268577E−08 | 4.627188E−09 | 6.674974E−10 | 1.843071E−09 | 1.319594E−08 |
| C2 | 3.193567E−12 | −5.266814E−14 | 2.315644E−13 | 4.289011E−13 | 5.402084E−12 |
| C3 | −1.596579E−16 | 2.137046E−18 | −6.968850E−18 | 1.594513E−17 | −1.867305E−16 |
| C4 | 9.929517E−21 | −4.215001E−23 | 1.939934E−22 | −1.418581E−21 | −2.952249E−22 |
| C5 | −4.198491E−25 | 8.116919E−28 | 4.518881E−28 | 3.966239E−26 | 1.127199E−24 |
| C6 | 1.525257E−29 | −1.111782E−32 | −1.675385E−32 | −2.085351E−31 | −1.348324E−28 |

TABLE 3

NA = 0.95, Y' = 14.02, λ = 193 nm

| SURF | RADIUS | THICKNESS | MATERIAL | SEMIDIAM. | |
|---|---|---|---|---|---|
| IMAGE | INFINITY | 31.9999 | | 56.08 | |
| 1 | 57573.384314 | 8.0000 | SIO2 | 64.47 | ASPHERE |
| 2 | 243.810838 | 13.2707 | | 66.13 | |
| 3 | −1090.143042 | 9.3540 | SIO2 | 67.42 | ASPHERE |
| 4 | 466.145521 | 37.5471 | | 70.64 | |
| 5 | −105.489077 | 75.0000 | SIO2 | 72.25 | |
| 6 | −148.914172 | 0.5855 | | 107.44 | |
| 7 | −934.566511 | 36.2435 | SIO2 | 123.61 | ASPHERE |
| 8 | −274.035276 | 0.6116 | | 127.26 | |
| 9 | 1877.003491 | 35.1457 | SIO2 | 133.59 | |
| 10 | −433.158396 | 0.6411 | | 134.34 | |
| 11 | 340.473694 | 28.3403 | SIO2 | 131.81 | |
| 12 | 1177.957955 | 0.9582 | | 130.18 | |
| 13 | 180.584787 | 34.5615 | SIO2 | 121.25 | |
| 14 | 206.758154 | 0.5010 | | 112.12 | |
| 15 | 155.938957 | 75.0000 | SIO2 | 108.37 | |
| 16 | 281.771324 | 15.0536 | | 85.61 | ASPHERE |
| 17 | 15953.615671 | 8.0000 | SIO2 | 83.06 | |
| 18 | 98.431585 | 77.0419 | | 68.55 | |
| 19 | −111.308146 | 8.0193 | SIO2 | 64.26 | |

TABLE 3-continued

NA = 0.95, Y' = 14.02, λ = 193 nm

| SURF | RADIUS | THICKNESS | MATERIAL | SEMIDIAM. | |
|---|---|---|---|---|---|
| 20 | −702.509172 | 18.0835 | | 68.14 | ASPHERE |
| 21 | −138.076465 | 8.3622 | SIO2 | 68.73 | |
| 22 | 416.972180 | 18.5234 | | 79.11 | |
| 23 | −11234.170087 | 41.8736 | SIO2 | 85.07 | ASPHERE |
| 24 | −150.892964 | 0.8082 | | 91.33 | |
| 25 | −1297.100948 | 8.0000 | SIO2 | 99.81 | |
| 26 | 253.311103 | 21.8807 | | 107.73 | |
| 27 | 1068.916725 | 45.0713 | SIO2 | 111.68 | |
| 28 | −236.444857 | 0.5000 | | 115.81 | |
| 29 | 244.447627 | 38.4473 | SIO2 | 149.24 | |
| 30 | 557.459687 | 26.8178 | | 148.57 | ASPHERE |
| 31 | INFINITY | −18.1738 | | 148.93 | APERTURE STOP |
| 32 | 360.543724 | 15.0000 | SIO2 | 150.98 | |
| 33 | 221.880515 | 36.5144 | | 147.91 | |
| 34 | 488.300751 | 77.1255 | SIO2 | 149.90 | |
| 35 | −279.914925 | 0.5220 | | 151.49 | |
| 36 | 187.875575 | 53.2248 | SIO2 | 142.93 | |
| 37 | 489.306568 | 0.9446 | | 139.20 | ASPHERE |
| 38 | 163.274968 | 44.1943 | SIO2 | 123.33 | |
| 39 | 325.397565 | 0.4997 | | 116.17 | ASPHERE |
| 40 | 140.866290 | 60.7172 | SIO2 | 100.50 | |
| 41 | 235.723786 | 2.9779 | | 73.26 | ASPHERE |
| 42 | 232.815045 | 16.6707 | SIO2 | 71.37 | |
| 43 | 582.776739 | 6.7517 | | 64.00 | |
| 44 | 375.408256 | 11.2935 | SIO2 | 50.14 | |
| 45 | 687.655215 | 7.0754 | | 42.35 | |
| 46 | INFINITY | 4.7317 | SIO2 | 24.53 | REFERENCE SURF. |
| 47 | INFINITY | 1.0000 | | 20.89 | |
| 48 | INFINITY | 3.6695 | CAF2 | 17.80 | |
| 49 | INFINITY | 1.1000 | HII165 | 14.80 | |
| IMAGE | INFINITY | | | 14.02 | |

TABLE 4

| | SRF | | | | |
|---|---|---|---|---|---|
| | 1 | 3 | 7 | 16 | 20 |
| K | 0 | 0 | 0 | 0 | 0 |
| C1 | 2.187157E−07 | 2.909419E−08 | −1.506913E−09 | −3.774747E−08 | −1.136180E−09 |
| C2 | −2.487757E−11 | 1.261210E−11 | 2.120740E−13 | 1.140271E−12 | −3.091171E−12 |
| C3 | 1.853585E−15 | −1.055565E−15 | 5.182820E−18 | 2.928811E−17 | −5.711004E−16 |
| C4 | −1.617589E−19 | 3.623046E−20 | 2.163295E−23 | −5.477432E−21 | 2.509741E−20 |
| C5 | 1.923071E−24 | 8.424309E−24 | −5.163241E−27 | 1.585045E−25 | 2.710175E−24 |
| C6 | 5.473790E−29 | −4.162924E−28 | 3.339083E−32 | 7.346294E−30 | −2.322363E−28 |

| | SRF | | | | |
|---|---|---|---|---|---|
| | 23 | 30 | 37 | 39 | 41 |
| K | 0 | 0 | 0 | 0 | 0 |
| C1 | −6.268577E−08 | 4.627188E−09 | 6.674974E−10 | 1.843071E−09 | 1.319594E−08 |
| C2 | 3.193567E−12 | −5.266814E−14 | 2.315644E−13 | 4.289011E−13 | 5.402084E−12 |
| C3 | −1.596579E−16 | 2.137046E−18 | −6.968850E−18 | 1.594513E−17 | −1.867305E−16 |
| C4 | 9.929517E−21 | −4.215001E−23 | 1.939934E−22 | −1.418581E−21 | −2.952249E−22 |
| C5 | −4.198491E−25 | 8.116919E−28 | 4.518881E−28 | 3.966239E−26 | 1.127199E−24 |
| C6 | 1.525257E−29 | −1.111782E−32 | −1.675385E−32 | −2.085351E−31 | −1.348324E−28 |

TABLE 5

NA = 1.1, Y' = 14.02 mm, λ = 193 nm

| SURF | RADIUS | THICKNESS | MATERIAL | SEMIDIAM. | |
|---|---|---|---|---|---|
| OBJECT | INFINITY | 32.0000 | | 56.08 | |
| 1 | −1066.602711 | 8.0563 | SIO2 | 65.27 | ASPHERE |
| 2 | 358.217958 | 15.2666 | | 67.67 | |
| 3 | −334.129682 | 8.1615 | SIO2 | 68.95 | ASPHERE |
| 4 | −6243.656071 | 32.1403 | | 72.81 | |
| 5 | −108.886491 | 70.1491 | SIO2 | 74.33 | |

TABLE 5-continued

NA = 1.1, Y' = 14.02 mm, λ = 193 nm

| SURF | RADIUS | THICKNESS | MATERIAL | SEMIDIAM. | |
|---|---|---|---|---|---|
| 6 | −162.370701 | 1.0002 | | 109.54 | |
| 7 | −727.415536 | 36.3939 | SIO2 | 125.60 | ASPHERE |
| 8 | −233.996290 | 1.0158 | | 128.33 | |
| 9 | −8325.959768 | 29.9853 | SIO2 | 135.35 | |
| 10 | −415.435599 | 1.0333 | | 136.34 | |
| 11 | 177.128671 | 48.8841 | SIO2 | 136.26 | |
| 12 | 394.092930 | 0.9934 | | 133.18 | |
| 13 | 177.674289 | 20.4474 | SIO2 | 122.65 | |
| 14 | 218.760132 | 0.9997 | | 118.11 | ASPHERE |
| 15 | 155.129049 | 47.5924 | SIO2 | 112.11 | |
| 16 | 241.576589 | 28.5702 | | 98.43 | |
| 17 | −760.329352 | 8.0230 | SIO2 | 95.63 | ASPHERE |
| 18 | 102.483692 | 81.6261 | | 76.43 | |
| 19 | −160.759918 | 8.0012 | SIO2 | 73.55 | |
| 20 | −288.343539 | 33.3581 | | 75.54 | ASPHERE |
| 21 | −94.382320 | 8.2003 | SIO2 | 75.76 | |
| 22 | 394.822387 | 43.2838 | | 100.85 | ASPHERE |
| 23 | −385.383825 | 48.2058 | SIO2 | 115.59 | ASPHERE |
| 24 | −159.655002 | 1.0063 | | 123.71 | |
| 25 | −1485.562918 | 41.6882 | SIO2 | 156.11 | ASPHERE |
| 26 | −312.715663 | 1.1073 | | 159.83 | |
| 27 | 790.020651 | 64.9662 | SIO2 | 185.20 | |
| 28 | −514.934547 | 48.4136 | | 186.27 | |
| 29 | INFINITY | 0.5481 | | 185.80 | APERTURE STOP |
| 30 | 1228.151287 | 85.2452 | SIO2 | 187.22 | |
| 31 | −726.438390 | 0.9998 | | 187.45 | ASPHERE |
| 32 | 544.431815 | 46.1431 | SIO2 | 180.44 | |
| 33 | −2171.764121 | 0.9995 | | 178.80 | |
| 34 | 322.816252 | 38.9105 | SIO2 | 159.18 | |
| 35 | 1245.766322 | 0.9997 | | 155.54 | ASPHERE |
| 36 | 152.840046 | 63.7288 | SIO2 | 122.83 | |
| 37 | 244.203299 | 0.9999 | | 103.65 | ASPHERE |
| 38 | 159.866555 | 74.5848 | SIO2 | 92.47 | ASPHERE |
| 39 | INFINITY | 25.6207 | SIO2 | 46.73 | REFERENCE SURF. |
| 40 | INFINITY | 6.0000 | H2O | 21.19 | |
| IMAGE | INFINITY | | | 14.02 | |

TABLE 6

| | SRF | | | | |
|---|---|---|---|---|---|
| | 1 | 3 | 7 | 14 | 17 |
| K | 0 | 0 | 0 | 0 | 0 |
| C1 | 1.682101E−07 | 4.148984E−08 | −1.035309E−09 | 6.946863E−09 | 2.578600E−08 |
| C2 | −1.536140E−11 | 7.725674E−12 | 3.103135E−13 | 3.241377E−13 | −5.660284E−13 |
| C3 | 6.867130E−16 | −4.830572E−16 | 1.001883E−18 | −4.306086E−18 | 1.329939E−17 |
| C4 | −1.797424E−20 | 2.352928E−20 | −7.442553E−25 | 8.578389E−23 | 1.538401E−21 |
| C5 | −4.136934E−24 | −4.436709E−24 | −1.281381E−27 | −7.514307E−27 | −3.075636E−26 |
| C6 | −1.971205E−29 | 7.544558E−28 | −8.639553E−32 | −7.533196E−32 | 8.746395E−32 |

| | SRF | | | | |
|---|---|---|---|---|---|
| | 20 | 22 | 23 | 25 | 31 |
| K | 0 | 0 | 0 | 0 | 0 |
| C1 | 3.602008E−08 | −2.118932E−08 | −2.013259E−08 | −3.674367E−09 | −6.430488E−10 |
| C2 | −1.047892E−12 | −3.324165E−13 | 5.305029E−13 | −1.712580E−14 | 6.148975E−14 |
| C3 | −2.178141E−16 | 8.256076E−17 | −7.762786E−18 | −6.227586E−19 | −8.956392E−19 |
| C4 | −6.411246E−21 | −5.452982E−21 | −5.673433E−23 | 8.693201E−23 | 9.279933E−24 |
| C5 | −1.191076E−24 | 1.933922E−25 | 9.056440E−27 | −2.568058E−27 | −3.601735E−29 |
| C6 | 1.034336E−28 | −2.974797E−30 | 2.970144E−32 | 3.597459E−32 | 1.328954E−34 |

| | SRF | | |
|---|---|---|---|
| | 35 | 37 | 38 |
| K | 0 | 0 | 0 |
| C1 | −9.264283E−10 | −1.283101E−08 | 1.288991E−09 |
| C2 | 1.671391E−13 | −7.830951E−13 | −6.616705E−13 |
| C3 | −2.698030E−18 | 3.201943E−17 | −5.104081E−17 |

TABLE 6-continued

| | | | |
|---|---|---|---|
| C4 | 9.294090E−23 | −1.774434E−21 | −2.725522E−21 |
| C5 | −2.047623E−27 | 1.119500E−25 | −1.005838E−25 |
| C6 | 2.673814E−32 | −3.106547E−30 | −2.861163E−30 |

TABLE 7

NA = 1.1, Y' = 14.02 mm, λ = 193 nm

| SURF | RADIUS | THICKNESS | MATERIAL | SEMIDIAM. | |
|---|---|---|---|---|---|
| OBJECT | INFINITY | 32.0000 | | 56.08 | |
| 1 | −1066.602711 | 8.0563 | SIO2 | 65.27 | ASPHERE |
| 2 | 358.217958 | 15.2666 | | 67.67 | |
| 3 | −334.129682 | 8.1615 | SIO2 | 68.95 | ASPHERE |
| 4 | −6243.656071 | 32.1403 | | 72.81 | |
| 5 | −108.886491 | 70.1491 | SIO2 | 74.33 | |
| 6 | −162.370701 | 1.0002 | | 109.54 | |
| 7 | −727.415536 | 36.3939 | SIO2 | 125.60 | ASPHERE |
| 8 | −233.996290 | 1.0158 | | 128.33 | |
| 9 | −8325.959768 | 29.9853 | SIO2 | 135.35 | |
| 10 | −415.435599 | 1.0333 | | 136.34 | |
| 11 | 177.128671 | 48.8841 | SIO2 | 136.26 | |
| 12 | 394.092930 | 0.9934 | | 133.18 | |
| 13 | 177.674289 | 20.4474 | SIO2 | 122.65 | |
| 14 | 218.760132 | 0.9997 | | 118.11 | ASPHERE |
| 15 | 155.129049 | 47.5924 | SIO2 | 112.11 | |
| 16 | 241.576589 | 28.5702 | | 98.43 | |
| 17 | −760.329352 | 8.0230 | SIO2 | 95.63 | ASPHERE |
| 18 | 102.483692 | 81.6261 | | 76.43 | |
| 19 | −160.759918 | 8.0012 | SIO2 | 73.55 | |
| 20 | −288.343539 | 33.3581 | | 75.54 | ASPHERE |
| 21 | −94.382320 | 8.2003 | SIO2 | 75.76 | ASPHERE |
| 22 | 394.822387 | 43.2838 | | 100.85 | ASPHERE |
| 23 | −385.383825 | 48.2058 | SIO2 | 115.59 | ASPHERE |
| 24 | −159.655002 | 1.0063 | | 123.71 | |
| 25 | −1485.562918 | 41.6882 | SIO2 | 156.11 | ASPHERE |
| 26 | −312.715663 | 1.1073 | | 159.83 | |
| 27 | 790.020651 | 64.9662 | SIO2 | 185.20 | |
| 28 | −514.934547 | 48.4136 | | 186.27 | |
| 29 | INFINITY | 0.5798 | | 185.80 | APERTURE STOP |
| 30 | 1228.151287 | 85.2452 | SIO2 | 187.22 | |
| 31 | −726.438390 | 1.0324 | | 187.45 | ASPHERE |
| 32 | 544.431815 | 46.1431 | SIO2 | 180.44 | |
| 33 | −2171.764121 | 0.8687 | | 178.79 | |
| 34 | 322.816252 | 38.9105 | SIO2 | 159.22 | |
| 35 | 1245.766322 | 1.0841 | | 155.58 | ASPHERE |
| 36 | 152.840046 | 63.7288 | SIO2 | 122.82 | |
| 37 | 244.203299 | 1.0033 | | 103.65 | ASPHERE |
| 38 | 159.869935 | 74.5848 | SIO2 | 92.46 | ASPHERE |
| 39 | INFINITY | 23.7339 | CAF2 | 46.71 | REFERENCE SURF. |
| 40 | INFINITY | 7.8900 | HII65 | 21.10 | |
| IMAGE | INFINITY | | | 14.02 | |

TABLE 8

| | SRF | | | | |
|---|---|---|---|---|---|
| | 1 | 3 | 7 | 14 | 17 |
| K | 0 | 0 | 0 | 0 | 0 |
| C1 | 1.682101E−07 | 4.148984E−08 | −1.035309E−09 | 6.946863E−09 | 2.578600E−08 |
| C2 | −1.536140E−11 | 7.725674E−12 | 3.103135E−13 | 3.241377E−13 | −5.660284E−13 |
| C3 | 6.867130E−16 | −4.830572E−16 | 1.001883E−18 | −4.306086E−18 | 1.329939E−17 |
| C4 | −1.797424E−20 | 2.352928E−20 | −7.442553E−25 | 8.578389E−23 | 1.538401E−21 |
| C5 | −4.136934E−24 | −4.436709E−24 | −1.281381E−27 | −7.514307E−27 | −3.075636E−26 |
| C6 | −1.971205E−29 | 7.544558E−28 | −8.639553E−32 | −7.533196E−32 | 8.746395E−32 |

| | SRF | | | | |
|---|---|---|---|---|---|
| | 20 | 22 | 23 | 25 | 31 |
| K | 0 | 0 | 0 | 0 | 0 |
| C1 | 3.602008E−08 | −2.118932E−08 | −2.013259E−08 | −3.674367E−09 | −6.392304E−10 |
| C2 | −1.047892E−12 | −3.324165E−13 | 5.305029E−13 | −1.712580E−14 | 6.150273E−14 |

TABLE 8-continued

| | | | | | |
|---|---|---|---|---|---|
| C3 | −2.178141E−16 | 8.256076E−17 | −7.762786E−18 | −6.227586E−19 | −9.042925E−19 |
| C4 | −6.411246E−21 | −5.452982E−21 | −5.673433E−23 | 8.693201E−23 | 9.648047E−24 |
| C5 | −1.191076E−24 | 1.933922E−25 | 9.056440E−27 | −2.568058E−27 | −4.433132E−29 |
| C6 | 1.034336E−28 | −2.974797E−30 | 2.970144E−32 | 3.597459E−32 | 2.048292E−34 |

| | SRF | | |
|---|---|---|---|
| SRF | 35 | 37 | 38 |
| K | 0 | 0 | 0 |
| C1 | −9.264283E−10 | −1.283101E−08 | 1.303301E−09 |
| C2 | 1.671391E−13 | −7.830951E−13 | −6.601270E−13 |
| C3 | −2.698030E−18 | 3.201943E−17 | −5.105707E−17 |
| C4 | 9.294090E−23 | −1.774434E−21 | −2.779961E−21 |
| C5 | −2.047623E−27 | 1.119500E−25 | −9.290760E−26 |
| C6 | 2.673814E−32 | −3.106547E−30 | −3.156575E−30 |

TABLE 9

NA = 1.2, Y' = 15.375 mm, λ = 193 nm

| SURFACE | RADIUS | THICKNESS | MATERIAL | SEMIDIAM. | |
|---|---|---|---|---|---|
| OBJECT | INFINITY | 35.3012 | | 61.50 | |
| 1 | 177.156823 | 26.9305 | SIO2 | 78.44 | |
| 2 | 842.185516 | 3.4517 | | 78.46 | |
| 3 | 233.914654 | 18.8070 | SIO2 | 79.19 | |
| 4 | 432.144774 | 31.5945 | | 78.06 | |
| 5 | 145.640231 | 10.1409 | SIO2 | 76.05 | |
| 6 | 109.083759 | 21.8314 | | 72.23 | |
| 7 | 172.753983 | 43.2151 | SIO2 | 73.33 | |
| 8 | −172.165293 | 2.5676 | | 71.86 | ASPHERE |
| 9 | 69.214204 | 62.9824 | SIO2 | 56.53 | |
| 10 | 80.002266 | 23.6863 | | 31.31 | |
| 11 | −104.992299 | 28.1589 | SIO2 | 35.92 | |
| 12 | −75.228220 | 9.0197 | | 46.17 | |
| 13 | −65.531764 | 10.1563 | SIO2 | 47.92 | |
| 14 | −448.993142 | 15.6522 | | 64.53 | |
| 15 | −181.112545 | 40.2092 | SIO2 | 70.93 | |
| 16 | −98.675296 | 1.0119 | | 80.95 | |
| 17 | −299.191173 | 53.3448 | SIO2 | 96.70 | |
| 18 | −121.365793 | 0.9998 | | 102.86 | |
| 19 | −840.837674 | 32.1993 | SIO2 | 106.62 | ASPHERE |
| 20 | −215.247677 | 113.4968 | | 108.28 | |
| 21 | INFINITY | 72.7208 | MIRROR | 102.04 | |
| 22 | −180.814564 | 50.0003 | SIO2 | 105.05 | ASPHERE |
| 23 | 28735.266222 | 247.2515 | | 101.80 | |
| 24 | 101.546480 | 12.5000 | SIO2 | 60.75 | |
| 25 | 2094.572934 | 44.8025 | | 68.67 | ASPHERE |
| 26 | 93.407835 | 12.5000 | SIO2 | 73.67 | |
| 27 | 183.071888 | 17.7821 | | 91.30 | |
| 28 | 145.950829 | 17.7821 | MIRROR | 96.39 | |
| 29 | 183.071888 | 12.5000 | SIO2 | 91.29 | |
| 30 | 93.407835 | 44.8025 | | 73.62 | |
| 31 | 2094.572934 | 12.5000 | SIO2 | 69.87 | ASPHERE |
| 32 | 101.546480 | 247.2515 | | 63.63 | |
| 33 | 28735.266222 | 50.0003 | SIO2 | 101.16 | |
| 34 | −180.814564 | 72.7208 | | 104.43 | ASPHERE |
| 35 | INFINITY | 105.0009 | MIRROR | 102.58 | |
| 36 | −273.451359 | 38.5333 | SIO2 | 106.72 | |
| 37 | 1123.894555 | 1.0338 | | 105.48 | |
| 38 | −184.574111 | 33.5372 | SIO2 | 98.29 | |
| 39 | −628.760227 | 3.8430 | | 94.14 | |
| 40 | −139.151905 | 34.3886 | SIO2 | 83.44 | |
| 41 | −190.600332 | 26.9288 | | 72.61 | |
| 42 | 254.408898 | 9.9992 | SIO2 | 70.48 | ASPHERE |
| 43 | −93.056854 | 49.7637 | | 61.57 | |
| 44 | 175.075847 | 9.9998 | SIO2 | 63.97 | |
| 45 | −238.203392 | 20.8156 | | 72.15 | |
| 46 | 896.609483 | 36.6866 | SIO2 | 76.87 | ASPHERE |
| 47 | 180.652404 | 1.3320 | | 85.28 | |
| 48 | 1804.061723 | 23.2396 | SIO2 | 92.998 | ASPHERE |
| 49 | 345.749725 | 46.5602 | | 96.86 | |
| 50 | −587.775122 | 49.7585 | SIO2 | 118.13 | |
| 51 | 362.614018 | 1.6818 | | 120.15 | ASPHERE |
| 52 | −804.887790 | 33.5831 | SIO2 | 120.64 | |

TABLE 9-continued

NA = 1.2, Y' = 15.375 mm, λ = 193 nm

| SURFACE | RADIUS | THICKNESS | MATERIAL | SEMIDIAM. | |
|---|---|---|---|---|---|
| 53 | 1202.126279 | 21.0194 | | 119.83 | |
| 54 | INFINITY | −18.9956 | | 116.43 | APERTURE STOP |
| 55 | −278.076999 | 51.3812 | SIO2 | 116.76 | |
| 56 | 708.681384 | 0.9999 | | 113.75 | ASPHERE |
| 57 | −424.250286 | 35.3000 | SIO2 | 110.60 | ASPHERE |
| 58 | 920.733201 | 1.1405 | | 107.31 | |
| 59 | −257.123792 | 33.3407 | SIO2 | 97.31 | |
| 60 | −3935.474584 | 1.2184 | | 91.01 | ASPHERE |
| 61 | −150.073636 | 36.9888 | SIO2 | 78.26 | |
| 62 | −820.239325 | 1.0000 | | 67.52 | |
| 63 | −54.559951 | 26.6860 | SIO2 | 44.06 | |
| 64 | INFINITY | 15.4767 | SIO2 | 33.82 | REFERENCE SURF. |
| 65 | INFINITY | 3.0000 | H2O | 20.00 | |
| IMAGE | INFINITY | | | 15.38 | |

TABLE 10

| | SRF | | | | |
|---|---|---|---|---|---|
| | 8 | 19 | 22 | 25 | 31 |
| K | 0 | 0 | 0 | 0 | 0 |
| C1 | 9.653041E−08 | −1.598157E−08 | 8.559799E−09 | 2.740432E−09 | 2.740432E−09 |
| C2 | 2.061765E−12 | −9.671056E−14 | 2.368248E−13 | −6.334652E−13 | −6.334652E−13 |
| C3 | −5.006746E−16 | −1.802623E−18 | −1.205912E−18 | 4.194914E−17 | 4.194914E−17 |
| C4 | 2.711741E−19 | 1.790955E−22 | 1.160876E−21 | −7.102777E−21 | −7.102777E−21 |
| C5 | −3.705742E−23 | −1.979558E−26 | −6.693112E−26 | 4.354797E−25 | 4.354797E−25 |
| C6 | 2.038408E−27 | 7.423000E−31 | 1.968939E−30 | −3.265977E−30 | −3.265977E−30 |

| | SRF | | | | |
|---|---|---|---|---|---|
| | 34 | 42 | 46 | 48 | 51 |
| K | 0 | 0 | 0 | 0 | 0 |
| C1 | 8.559799E−09 | −3.941346E−08 | −7.753026E−09 | 3.266652E−08 | −7.456419E−09 |
| C2 | 2.368248E−13 | −5.360633E−12 | 3.576163E−12 | −2.249934E−12 | −1.520134E−13 |
| C3 | −1.205912E−18 | 1.154412E−15 | −1.406125E−16 | 3.680290E−17 | −7.163026E−18 |
| C4 | 1.160876E−21 | −1.655376E−19 | −2.162953E−20 | −2.439274E−21 | −4.832175E−22 |
| C5 | −6.693112E−26 | 1.480086E−23 | −2.748677E−25 | 9.960088E−25 | 4.261878E−26 |
| C6 | 1.968939E−30 | −5.981294E−28 | −4.242454E−28 | −2.603852E−29 | −6.329452E−31 |

| | SRF | | |
|---|---|---|---|
| | 56 | 57 | 60 |
| K | 0 | 0 | 0 |
| C1 | −5.471504E−08 | 3.190975E−08 | 5.647038E−09 |
| C2 | 1.591373E−12 | −1.307089E−12 | −4.118516E−12 |
| C3 | −3.513507E−17 | 5.079085E−17 | 3.453701E−16 |
| C4 | 2.586932E−21 | 9.727584E−22 | −2.370265E−20 |
| C5 | −9.871739E−26 | −7.142117E−26 | 1.070189E−24 |
| C6 | 1.288510E−30 | 9.539739E−31 | −2.317458E−29 |

TABLE 11

NA = 1.2, Y' = 15.375 mm, λ = 193 nm

| SURFACE | RADIUS | THICKNESS | MATERIAL | SEMIDIAM. | |
|---|---|---|---|---|---|
| OBJECT | INFINITY | 35.3012 | | 61.50 | |
| 1 | 177.156823 | 26.9305 | SIO2 | 78.44 | |
| 2 | 842.185516 | 3.4517 | | 78.46 | |
| 3 | 233.914654 | 18.8070 | SIO2 | 79.19 | |
| 4 | 432.144774 | 31.5945 | | 78.06 | |
| 5 | 145.640231 | 10.1409 | SIO2 | 76.05 | |
| 6 | 109.083759 | 21.8314 | | 72.23 | |
| 7 | 172.753983 | 43.2151 | SIO2 | 73.33 | |
| 8 | −172.165293 | 2.5676 | | 71.86 | ASPHERE |
| 9 | 69.214204 | 62.9824 | SIO2 | 56.53 | |
| 10 | 80.002266 | 23.6863 | | 31.31 | |

TABLE 11-continued

NA = 1.2, Y' = 15.375 mm, λ = 193 nm

| SURFACE | RADIUS | THICKNESS | MATERIAL | SEMIDIAM. | |
|---|---|---|---|---|---|
| 11 | −104.992299 | 28.1589 | SIO2 | 35.92 | |
| 12 | −75.228220 | 9.0197 | | 46.17 | |
| 13 | −65.531764 | 10.1563 | SIO2 | 47.92 | |
| 14 | −448.993142 | 15.6522 | | 64.53 | |
| 15 | −181.112545 | 40.2092 | SIO2 | 70.93 | |
| 16 | −98.675296 | 1.0119 | | 80.95 | |
| 17 | −299.191173 | 53.3448 | SIO2 | 96.70 | |
| 18 | −121.365793 | 0.9998 | | 102.86 | |
| 19 | −840.837674 | 32.1993 | SIO2 | 106.62 | ASPHERE |
| 20 | −215.247677 | 113.4968 | | 108.28 | |
| 21 | INFINITY | 72.7208 | MIRROR | 102.04 | |
| 22 | −180.814564 | 50.0003 | SIO2 | 105.05 | ASPHERE |
| 23 | 28735.266222 | 247.2515 | | 101.80 | |
| 24 | 101.546480 | 12.5000 | SIO2 | 60.75 | |
| 25 | 2094.572934 | 44.8025 | | 68.67 | ASPHERE |
| 26 | 93.407835 | 12.5000 | SIO2 | 73.67 | |
| 27 | 183.071888 | 17.7821 | | 91.30 | |
| 28 | 145.950829 | 17.7821 | MIRROR | 96.39 | |
| 29 | 183.071888 | 12.5000 | SIO2 | 91.29 | |
| 30 | 93.407835 | 44.8025 | | 73.62 | |
| 31 | 2094.572934 | 12.5000 | SIO2 | 69.87 | ASPHERE |
| 32 | 101.546480 | 247.2515 | | 63.63 | |
| 33 | 28735.266222 | 50.0003 | SIO2 | 101.16 | |
| 34 | −180.814564 | 72.7208 | | 104.43 | ASPHERE |
| 35 | INFINITY | 105.0009 | MIRROR | 102.58 | |
| 36 | −273.451359 | 38.5333 | SIO2 | 106.72 | |
| 37 | 1123.894555 | 1.0338 | | 105.48 | |
| 38 | −184.574111 | 33.5372 | SIO2 | 98.29 | |
| 39 | −628.760227 | 3.8430 | | 94.14 | |
| 40 | −139.151905 | 34.3886 | SIO2 | 83.44 | |
| 41 | −190.600332 | 26.9288 | | 72.61 | |
| 42 | 254.408898 | 9.9992 | SIO2 | 70.48 | ASPHERE |
| 43 | −93.056854 | 49.7637 | | 61.57 | |
| 44 | 175.075847 | 9.9998 | SIO2 | 63.97 | |
| 45 | −238.203392 | 20.8156 | | 72.15 | |
| 46 | 896.609483 | 36.6866 | SIO2 | 76.87 | ASPHERE |
| 47 | 180.652404 | 1.3320 | | 85.28 | |
| 48 | 1804.061723 | 23.2396 | SIO2 | 92.998 | ASPHERE |
| 49 | 345.749725 | 46.5602 | | 96.86 | |
| 50 | −587.775122 | 49.7585 | SIO2 | 118.13 | |
| 51 | 362.614018 | 1.6818 | | 120.15 | ASPHERE |
| 52 | −804.887790 | 33.5831 | SIO2 | 120.64 | |
| 53 | 1202.126279 | 21.0194 | | 119.83 | |
| 54 | INFINITY | −18.9964 | | 116.43 | APERTURE STOP |
| 55 | −278.076999 | 51.3812 | SIO2 | 116.76 | |
| 56 | 708.681384 | 0.9772 | | 113.75 | ASPHERE |
| 57 | −424.250286 | 35.3000 | SIO2 | 110.61 | ASPHERE |
| 58 | 920.733201 | 1.1846 | | 107.31 | |
| 59 | −257.123792 | 33.3407 | SIO2 | 97.30 | |
| 60 | −3935.474584 | 1.1938 | | 90.99 | ASPHERE |
| 61 | −150.073636 | 36.9888 | SIO2 | 78.26 | |
| 62 | −820.239325 | 1.0016 | | 67.52 | |
| 63 | −54.559951 | 26.6860 | SIO2 | 44.06 | |
| 64 | INFINITY | 13.2537 | CAF2 | 38.82 | REFERENCE SURF. |
| 65 | INFINITY | 5.2500 | HII165 | 20.99 | |
| IMAGE | INFINITY | | | 15.38 | |

TABLE 12

| | SRF | | | | |
|---|---|---|---|---|---|
| | 8 | 19 | 22 | 25 | 31 |
| K | 0 | 0 | 0 | 0 | 0 |
| C1 | 9.653041E−08 | −1.598157E−08 | 8.559799E−09 | 2.740432E−09 | 2.740432E−09 |
| C2 | 2.061765E−12 | −9.671056E−14 | 2.368248E−13 | −6.334652E−13 | −6.334652E−13 |
| C3 | −5.006746E−16 | −1.802623E−18 | −1.205912E−18 | 4.194914E−17 | 4.194914E−17 |
| C4 | 2.711741E−19 | 1.790955E−22 | 1.160876E−21 | −7.102777E−21 | −7.102777E−21 |
| C5 | −3.705742E−23 | −1.979558E−26 | −6.693112E−26 | 4.354797E−25 | 4.354797E−25 |
| C6 | 2.038408E−27 | 7.423000E−31 | 1.968939E−30 | −3.265977E−30 | −3.265977E−30 |

TABLE 12-continued

| | | | SRF | | |
|---|---|---|---|---|---|
| | 34 | 42 | 46 | 48 | 51 |
| K | 0 | 0 | 0 | 0 | 0 |
| C1 | 8.559799E−09 | −3.941346E−08 | −7.753026E−09 | 3.266652E−08 | −7.456419E−09 |
| C2 | 2.368248E−13 | −5.360633E−12 | 3.576163E−12 | −2.249934E−12 | −1.520134E−13 |
| C3 | −1.205912E−18 | 1.154412E−15 | −1.406125E−16 | 3.680290E−17 | −7.163026E−18 |
| C4 | 1.160876E−21 | −1.655376E−19 | −2.162953E−20 | −2.439274E−21 | −4.832175E−22 |
| C5 | −6.693112E−26 | 1.480086E−23 | −2.748677E−25 | 9.960088E−25 | 4.261878E−26 |
| C6 | 1.968939E−30 | −5.981294E−28 | −4.242454E−28 | −2.603852E−29 | −6.329452E−31 |

| | | SRF | |
|---|---|---|---|
| | 56 | 57 | 60 |
| K | 0 | 0 | 0 |
| C1 | −5.459666E−08 | 3.197270E−08 | 5.594907E−09 |
| C2 | 1.566439E−12 | −1.327205E−12 | −4.102933E−12 |
| C3 | −3.144156E−17 | 5.534350E−17 | 3.428146E−16 |
| C4 | 2.165210E−21 | 3.279608E−22 | −2.364988E−20 |
| C5 | −7.316405E−26 | −2.849328E−26 | 1.089644E−24 |
| C6 | 7.132969E−31 | −8.531622E−32 | −2.435287E−29 |

TABLE 13

| | | | | Data at Reference Surface | | | |
|---|---|---|---|---|---|---|---|
| Embodiment | Operating Mode | $n_{FL}$ | NA | SUM mm | RSH mm | OPD mm | SPH mm |
| 1 | H2O | 1.43 | 0.95 | 15.70 | 24.53 | −3.786 | 0.709 |
| | high refr. ind. | 1.65 | 0.95 | 15.71 | 24.53 | −3.787 | 0.709 |
| | Difference % | | | 0.08 | 0.00 | 0.03 | −0.02 |
| 2 | H2O | 1.43 | 1.1 | 48.60 | 46.73 | −14.697 | 2.759 |
| | high refr. ind. | 1.65 | 1.1 | 48.67 | 46.71 | −14.690 | 2.756 |
| | Difference % | | | 0.13 | −0.04 | −0.05 | −0.11 |
| 3 | H2O | 1.43 | 1.2 | 28.46 | 33.82 | −10.652 | 1.753 |
| | high refr. ind. | 1.65 | 1.2 | 28.57 | 33.82 | −10.652 | 1.750 |
| | Difference % | | | 0.38 | 0.00 | 0.00 | −0.16 |

The invention claimed is:

1. A projection objective serving to project an image of an object arranged in an object plane onto a substrate arranged in an image plane, comprising:
   an object-side-oriented part arranged adjacent to the object plane and including a plurality of optical elements;
   an image-side-oriented part arranged adjacent to the image plane and including a free space serving to receive a liquid; and
   at least a part of an optical end-position element serving to delimit the free space towards the object side, wherein the projection objective is operable in different modes of operation in which the free space is filled with liquids that differ in their respective indices of refraction.

2. Projection objective according to claim 1, wherein the image-side-oriented part of the objective is configured differently for the different modes of operation.

3. A projection objective serving to project an image of an object arranged in an object plane onto a substrate arranged in an image plane comprising:
   an object-side-oriented part arranged adjacent to the object plane and including a plurality of optical elements;
   an image-side-oriented part arranged adjacent to the image plane and including a free space serving to receive a liquid; and
   at least a part of an optical end-position element serving to delimit the free space towards the object side, wherein the projection objective is assembled by combining the object-side-oriented part of the objective with one of a plurality of variant versions of the image-side-oriented part of the objective which are adapted, respectively, to the different modes of operation of the projection objective in which the free space is filled with liquids that differ in their respective indices of refraction.

4. Projection objective according to claim 3, wherein the free space is configured to receive the liquid between the image plane and the optical end-position element.

5. Projection objective according to claim 3, wherein the optical end-position element has a planar surface on the image side.

6. Projection objective according to claim 3, wherein the optical end-position element is configured as a planar-parallel plate.

7. Projection objective according to claim 3, wherein the optical end-position element is configured as a planar-parallel plate which contiguously adjoins a planar surface of a planar-convex lens.

8. Projection objective according to claim 3, wherein the optical end-position element is configured as a planar-convex lens.

9. Projection objective according to claim 3, wherein the optical end-position element consists of one of the materials from the group consisting of quartz, calcium fluoride, and barium fluoride.

10. Projection objective according to claim 3, wherein the optical end-position element is configured differently for the different modes of operation in regard to at least one of the parameters from the group consisting of thickness, refractive index and image-side coating.

11. Projection objective according to claim 3, wherein the free space which serves to receive the liquid has a different thickness in the different modes of operation.

12. Projection objective according to claim 3, wherein the sum of the multiplication product of the refractive index of the liquid and the thickness of the free space serving to receive the liquid, and the multiplication product of the refractive index and thickness of the optical end-position element to the extent that the latter belongs to the image-side-oriented part of the objective, is at least approximately equal in the different modes of operation.

13. Projection objective according to claim 3, wherein the image-side-oriented part of the objective is to a large extent free of refractive power.

14. Projection objective according to claim 3, wherein in one mode of operation the free space which serves to receive the liquid is filled with water, and the optical end-position element, to the extent that the latter belongs to the image-side-oriented part of the objective, is configured as a planar-parallel plate of quartz, glass, and wherein in another mode of operation the free space is filled with a liquid whose refractive index is greater than the refractive index of water, and the optical end-position element is configured as a planar-parallel plate of calcium fluoride.

15. Projection objective according to claim 3, wherein the image-side-oriented part of the objective has an at least approximately equal amount of spherical aberration in the different modes of operation, with the numerical aperture on the image side being equal for said different modes of operation.

16. Projection objective according to claim 3, wherein the optical path length difference between the principal ray and the marginal rays of the bundle through the center, measured from a reference surface that is formed between the object-side-oriented part and the image-side-oriented part of the objective to the image plane, differs by less than 2% between the different operating modes, with the numerical aperture on the image side being equal for said different modes of operation.

17. Projection objective according to claim 3, wherein the projection objective has at least approximately the same numerical aperture on the image side in the different modes of operation.

18. Projection objective according to claim 3, wherein the numerical aperture on the image side is at least 0.75.

19. Projection objective according to claim 3, wherein in one mode of operation a liquid is specified with a refractive index that is smaller than the refractive index of one of the optical elements or of the optical end-position element and in another mode of operation a liquid is specified with a refractive index that is larger than the refractive index of said optical element.

20. Projection objective according to claim 3, wherein in one of the modes of operation a liquid is specified with a refractive index larger than 1.0.

21. Projection objective according to claim 3, wherein in one of the modes of operation water is specified as the liquid.

22. Projection objective according to claim 3, wherein in one of the modes of operation a liquid is specified with a refractive index larger than 1.6.

23. Projection objective according to claim 3, wherein the object-side-oriented part of the objective is configured differently in the different modes of operation.

24. Projection objective according to claim 3, wherein the object-side-oriented part is configured differently in the different modes of operation at least in regard to a clearance distance between two neighboring optical elements.

25. Projection objective according to claim 24, wherein at least one of the optical elements whose clearance distance is different in the different modes of operation is coupled to an adjustment device.

26. Projection objective according to claim 3, wherein the object-side-oriented part has at least one optical element that is different in the different modes of operation with regard to its shape.

27. Projection objective according to claim 26, wherein the object-side-oriented part has at a maximum of five optical elements that are different in the different modes of operation with regard to their shape.

28. Projection objective according to one of the claim 26, wherein the optical element that is different with regard to its shape is configured as an exchange part and is arranged in the vicinity of the reference surface, or of an aperture plane, or of a conjugate aperture plane.

29. Projection objective according to claim 16, wherein the optical path length difference between the principal ray and the marginal rays of the bundle through the center differ by less than 1% between the different operating modes.

30. Projection objective according to claim 16, wherein the optical path length difference between the principal ray and the marginal rays of the bundle through the center differ by less than 0.5% between the different operating modes.

31. Projection objective according to claim 20, wherein the refractive index is larger than 1.3.

32. Projection objective according to claim 20, wherein the refractive index larger than 1.4.

33. A projection objective serving to project an image of an object arranged in an object plane onto a substrate arranged in an image plane comprising:

an object-side-oriented part arranged adjacent to the object plane and including a plurality of optical elements;

an image-side-oriented part arranged adjacent to the image plane and including a free space serving to receive a liquid; and at least a part of an optical end-position element serving to delimit the free space towards the object side, wherein the projection objective is assembled by combining the object-side-oriented part of the objective with one of a plurality of variant versions of the image-side-oriented part of the objective which are adapted, respectively, to the different modes of operation of the projection objective in which the free space is filled with liquids that differ in their respective indices of refraction, wherein the sum of the multiplication product of the refractive index of the liquid and the thickness of the free space serving to receive the liquid, and the multiplication product of the refractive index and thickness of the optical end-position element to the extent that the latter belongs to the image-side-oriented part of the objective, differs by less than 2% between the different modes of operation.

34. Projection objective according to claim 33, wherein the multiplication products differs by less than 1%.

35. A projection objective serving to project an image of an object arranged in an object plane onto a substrate arranged in an image plane comprising:

an object-side-oriented part arranged adjacent to the object plane and including a plurality of optical elements;

an image-side-oriented part arranged adjacent to the image plane and including a free space serving to receive a liquid; and at least a part of an optical end-position element serving to delimit the free space towards the object side, wherein the projection objective is assembled by combining the object-side-oriented part of the objective with one of a plurality of variant versions of the image-side-oriented part of the objective which are adapted, respectively, to the different modes of operation of the projection objective in which the free space is filled with liquids that differ in their respective indices of refraction, wherein the spherical aberration of the image-side-oriented part of the objective differs by less than 5% in the different modes of operation, with the numerical aperture on the image side being equal for said different modes of operation.

36. Projection objective according to claim 35, wherein the spherical aberration of the image-side-oriented part of the objective differs by less than 3% in the different modes of operation.

37. Projection objective according to claim 35, wherein the spherical aberration of the image-side-oriented part of the objective differs by less than 1% in the different modes of operation.

38. A projection objective serving to project an image of an object arranged in an object plane onto a substrate arranged in an image plane comprising:
an object-side-oriented part arranged adjacent to the object plane and including a plurality of optical elements;
an image-side-oriented part arranged adjacent to the image plane and including a free space serving to receive a liquid; and
at least a part of an optical end-position element serving to delimit the free space towards the object side, wherein the projection objective is assembled by combining the object-side-oriented part of the objective with one of a plurality of variant versions of the image-side-oriented part of the objective which are adapted, respectively, to the different modes of operation of the projection objective in which the free space is filled with liquids that differ in their respective indices of refraction, wherein in the area of a reference surface that is formed between the object-side-oriented part and the image-side-oriented part of the objective, the heights of the marginal rays of the bundle of rays through the center differ by less than 2% between the different modes of operation, with the numerical aperture on the image side being equal for said different modes of operation.

39. Projection objective according to claim 38, wherein the heights of the marginal rays of the bundle of rays through the center differ by less than 1% in the different modes of operation.

40. Projection objective according to claim 38, wherein the heights of the marginal rays of the bundle of rays through the center differ by less than 0.5% in the different modes of operation.

41. A refractive projection objective serving to project an image of an object arranged in an object plane onto a substrate arranged in an image plane comprising:
an object-side-oriented part arranged adjacent to the object plane and including a plurality of optical elements;
an image-side-oriented part arranged adjacent to the image plane and including a free space serving to receive a liquid; and
at least a part of an optical end-position element serving to delimit the free space towards the object side, wherein the beam diameter of the light used to produce the image has two local maxima between the object plane and the image plane, and a local minimum lying in between the two local maxima, and wherein the projection objective is operable in different modes of operation in which the free space is filled with liquids that differ in their respective indices of refraction.

42. A refractive projection objective serving to project an image of an object arranged in an object plane onto a substrate arranged in an image plane comprising:
an object-side-oriented part arranged adjacent to the object plane and including a plurality of optical elements;
an image-side-oriented part of the objective arranged adjacent to the image plane and including a free space serving to receive a liquid; and
at least a part of an optical end-position element serving to delimit the free space towards the object side, wherein the projection objective is assembled by combining the object-side-oriented part of the objective with one of a plurality of variant versions of the image-side-oriented part of the objective in which the beam diameter of the light used to produce the image has two local maxima between the object plane and the image plane, and a local minimum lying in between the two local maxima and which is adapted to different modes of operation of the projection objective in which the free space is filled with liquids that differ in their respective indices of refraction.

43. A catadioptric projection objective serving to project an image of an object arranged in an object plane onto a substrate arranged in an image plane comprising:
an object-side-oriented part of the objective arranged adjacent to the object plane and including a plurality of optical elements;
an image-side-oriented part of the objective arranged adjacent to the image plane and including a free space serving to receive a liquid; and
at least a part of an optical end-position element serving to delimit the free space towards the object side, wherein the projection objective is operable in different modes of operation in which the free space is filled with liquids that differ in their respective indices of refraction.

44. A catadioptric projection objection serving to project an image of an object arranged in an object plane onto a substrate arranged in an image plane comprising:
an object-side-oriented part of the objective which is arranged adjacent to the object plane, includes a plurality of optical elements, and produces more than one intermediate image;
an image-side-oriented part of the objective which is arranged adjacent to the image plane and includes a free space serving to receive a liquid; and
at least a part of an optical end-position element serving to delimit the free space towards the object side, wherein the projection objective is assembled by combining the object-side-oriented part of the objective with one of a plurality of variant versions of the image-side-oriented part of the objective which are adapted, respectively, to the different modes of operation of the projection objective in which the free space is filled with fluids liquids that differ in their respective indices of refraction.

45. A projection objective serving to project an image of an object arranged in an object plane onto a substrate arranged in an image plane comprising:
an optical end-position element which is wetted by a liquid, wherein the projection objective has a numerical aperture on the image side which is at least as large as 1.2 and does not exceed an amount of 0.84 times the refractive index of the fluid.

46. A method of converting a projection objective, which projects an image of an object arranged in an object plane onto a substrate arranged in an image plane, comprising the steps of:
 providing the projection objective that includes an object-side-oriented part arranged adjacent to the object plane and including a plurality of optical elements, and which further has an image-side-oriented part arranged adjacent to the image plane and including a free space serving to receive a liquid and further including at least a part of an optical end-position element serving to delimit the free space towards the object side; and
 converting the projection objective from a first mode of operation to a second mode of operation by exchanging a first liquid which is contained in the free space of the image-side-oriented part and has a first refractive index against a second liquid with a second refractive index that is different from said first refractive index.

47. Method according to claim 46, wherein the optical end-position element is exchanged and/or readjusted.

48. Method according to claim 46, wherein after the changes have been made in the image-side-oriented part of the objective, the object-side-oriented part of the objective is adapted to the image-side-oriented part of the objective.

49. Method according to claim 46, wherein at least one component of a liquid supply system that is configured for the first liquid is exchanged for a component that is configured for the second liquid.

50. Method according to claim 49, wherein a pump or a filter is exchanged.

51. A method for the manufacture of a projection objective which projects an image of an object arranged in an object plane onto a substrate arranged in an image plane, the projection objective having an object-side-oriented part arranged adjacent to the object plane and including a plurality of optical elements, and an image-side-oriented part arranged adjacent to the image plane and including a free space serving to receive a liquid, the projection objective further including at least a part of an optical end-position element serving to delimit the free space towards the object side, wherein the method comprises the steps of:
 assembling the projection objective by combining the object-side-oriented part of the objective with one of a plurality of variant versions of the image-side-oriented part of the objective which are adapted, respectively, to different modes of operation of the projection objective; and
 filling the free space with liquids that differ in their respective indices of refraction.

* * * * *